(12) United States Patent
Hampali et al.

(10) Patent No.: US 11,797,724 B2
(45) Date of Patent: Oct. 24, 2023

(54) SCENE LAYOUT ESTIMATION

(71) Applicant: QUALCOMM Technologies, Inc., San Diego, CA (US)

(72) Inventors: Shreyas Hampali, Styria (AT); Sinisa Stekovic, Graz (AT); Friedrich Fraundorfer, Graz (AT); Vincent Lepetit, Talence (FR)

(73) Assignee: QUALCOMM Incorporated, San Diego, CA (US)

( * ) Notice: Subject to any disclaimer, the term of this patent is extended or adjusted under 35 U.S.C. 154(b) by 122 days.

(21) Appl. No.: 17/454,020

(22) Filed: Nov. 8, 2021

(65) Prior Publication Data

US 2022/0156426 A1 May 19, 2022

Related U.S. Application Data

(60) Provisional application No. 63/113,722, filed on Nov. 13, 2020.

(51) Int. Cl.
*G06T 17/20* (2006.01)
*G06F 30/13* (2020.01)
*G06T 7/55* (2017.01)

(52) U.S. Cl.
CPC ............ *G06F 30/13* (2020.01); *G06T 7/55* (2017.01); *G06T 17/20* (2013.01); *G06T 2207/10028* (2013.01); *G06T 2210/12* (2013.01)

(58) Field of Classification Search
None
See application file for complete search history.

(56) References Cited

U.S. PATENT DOCUMENTS

2020/0111251 A1\* 4/2020 Shi .................. G06T 17/00
2021/0019453 A1\* 1/2021 Yang ............... G06F 30/13

OTHER PUBLICATIONS

Huang et al. "Holistic 3D Scene Parsing and Reconstruction from a Single RGB image", Proceedings of the European conference on computer vision (ECCV). 2018 (Year: 2018).\*
Mitash et al. "Improving 6D Pose Estimation of Objects in Clutter via Physics-aware Monte Carlo Tree Search", 2018 IEEE International Conference on Robotics and Automation (ICRA) May 21-25, 2018, Brisbane, Australia (Year: 2018).\*

(Continued)

*Primary Examiner* — Saptarshi Mazumder
(74) *Attorney, Agent, or Firm* — Polsinelli/Qualcomm

(57) ABSTRACT

Systems and techniques are provided for determining environmental layouts. For example, based on one or more images of an environment and depth information associated with the one or more images, a set of candidate layouts and a set of candidate objects corresponding to the environment can be detected. The set of candidate layouts and set of candidate objects can be organized as a structured tree. For instance, a structured tree can be generated including nodes corresponding to the set of candidate layouts and the set of candidate objects. A combination of objects and layouts can be selected in the structured tree (e.g., based on a search of the structured tree, such as using a Monte-Carlo Tree Search (MCTS) algorithm or adapted MCTS algorithm). A three-dimensional (3D) layout of the environment can be determined based on the combination of objects and layouts in the structured tree.

30 Claims, 20 Drawing Sheets

(56) References Cited

OTHER PUBLICATIONS

Bauer D., et al., "VeREFINE: Integrating Object Pose Verification With Physics-Guided Iterative Refinement", IEEE Robotics and Automation Letters, IEEE, vol. 5, No. 3, May 20, 2020, XP011791479, pp. 4289-4296, Section III, Section IV.
International Search Report and Written Opinion—PCT/US2021/072304—ISA/EPO—dated Feb. 28, 2022.
Mitash C., et al., "Improving 6D Pose Estimation of Objects in Clutter Via Physics-Aware Monte Carlo Tree Search", 2018 IEEE International Conference on Robotics and Automation, IEEE, May 21, 2018, XP033403572, pp. 1-8, Abstract, Section I, Par. 2 Section III, Par. 1, Section III.A, Section III.C, Figure 1.

* cited by examiner

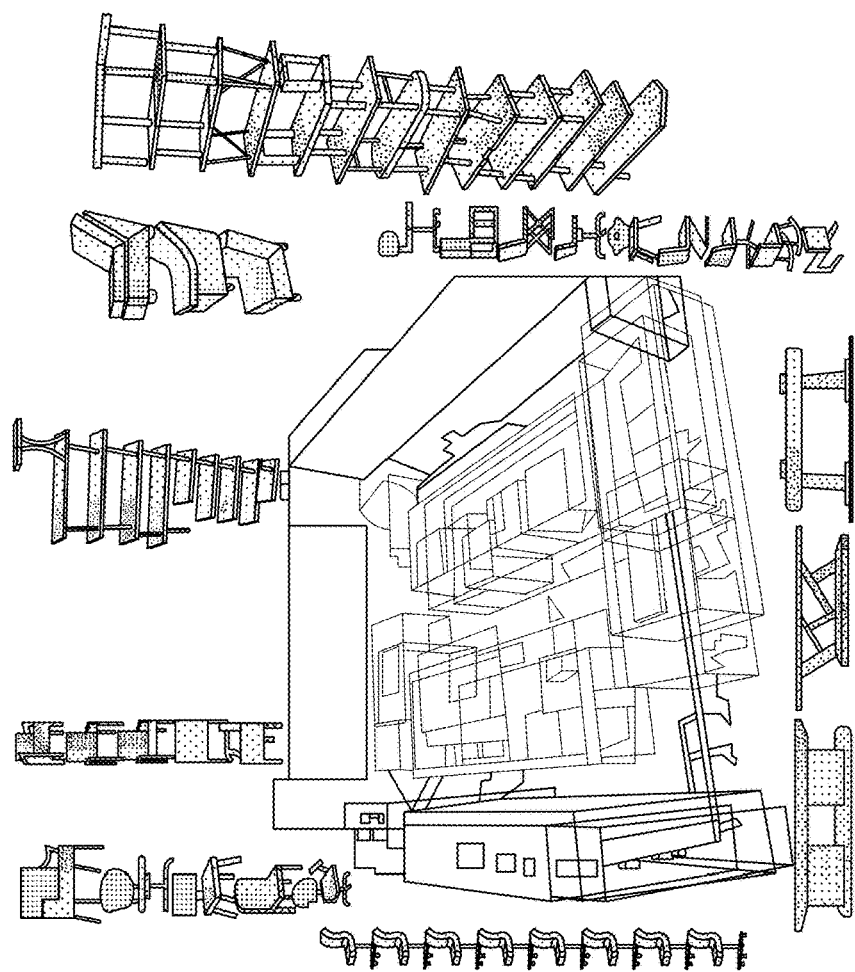
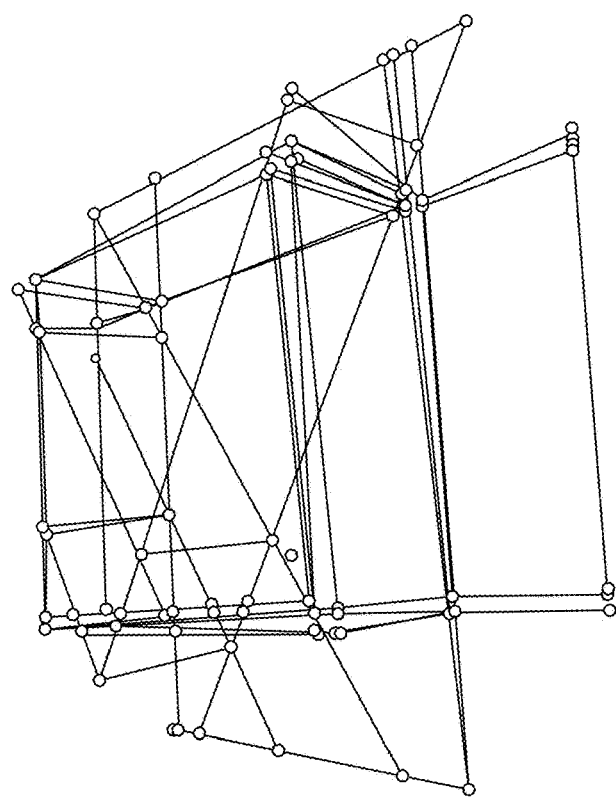
FIG. 6B

1100

DETECT, BASED ON ONE OR MORE IMAGES OF AN ENVIRONMENT AND DEPTH INFORMATION, A SET OF CANDIDATE LAYOUTS AND A SET OF CANDIDATE OBJECTS CORRESPONDING TO THE ENVIRONMENT
1102

GENERATE A STRUCTURED TREE COMPRISING NODES CORRESPONDING TO THE SET OF CANDIDATE LAYOUTS AND THE SET OF CANDIDATE OBJECTS
1104

SELECT A COMBINATION OF OBJECTS AND LAYOUTS IN THE STRUCTURED TREE
1106

DETERMINE A THREE-DIMENSIONAL (3D) LAYOUT OF THE ENVIRONMENT BASED ON THE COMBINATION OF OBJECTS AND LAYOUTS IN THE STRUCTURED TREE
1108

FIG. 11

SCENE LAYOUT ESTIMATION

CROSS-REFERENCE TO RELATED APPLICATIONS

The present application claims the benefit of U.S. Provisional Application No. 63/113,722, filed Nov. 13, 2020, entitled "LAYOUT AND OBJECT ESTIMATION FOR SCENES IN IMAGES," which is hereby incorporated by reference in its entirety and for all purposes.

TECHNICAL FIELD

The present disclosures generally relate to estimating layouts and objects of scenes in images, and more specifically to performing layout and object estimation using scene search techniques.

SUMMARY

In some embodiments, systems and techniques are described for estimating a layout (e.g., a three-dimensional (3D) layout) and objects of a scene or environment depicted in an image. 3D room layout (e.g., walls, floor, ceiling, etc.) and object (e.g., chairs, tables, etc.) estimation from images (e.g., red-green-blue (RGB) images, RGB-Depth (RGB-D) images, or other images) is useful for many vision guided tasks, such as indoor navigation, augmented reality (AR), robotics, automotive, aviation, three-dimensional scene understanding, object grasping, object tracking, among other tasks. For example, knowing the 3D layout of a room provides a stable landmark for localization.

Layout and object estimation for scenes can be difficult in some scenarios. For instance, occlusions by objects in a room or other space (e.g., occlusions caused by furniture in a room) can cause problems when performing layout and object estimation. In one example, important image features of an environment, such as corners or edges, might be unobservable or only partially observable due to the occlusions. In other examples, occlusions can cause illumination effects (e.g., shadows, reflections, among others), can cause lack of textures in wall and ceiling regions, can lead to limited annotated data (e.g., for machine learning approaches), among others.

Systems and techniques described herein provide improved layout and object estimation, including 3D layout estimation, from one or more images. According to at least one example, a method of determining one or more environmental layouts and objects is provided. The method can include: detecting, based on one or more images of an environment and depth information associated with the one or more images, a set of candidate layouts and a set of candidate objects corresponding to the environment; generating a structured tree including nodes corresponding to the set of candidate layouts and the set of candidate objects; selecting a combination of objects and layouts in the structured tree; and determining a three-dimensional (3D) layout of the environment based on the combination of objects and layouts in the structured tree.

In another example, an apparatus for determining one or more environmental layouts and objects is provided. The apparatus includes at least one memory and at least one processor (e.g., implemented in circuitry) coupled to the at least one memory. The at least one processor is configured to: detect, based on one or more images of an environment and depth information associated with the one or more images, a set of candidate layouts and a set of candidate objects corresponding to the environment; generate a structured tree including nodes corresponding to the set of candidate layouts and the set of candidate objects; select a combination of objects and layouts in the structured tree; and determine a three-dimensional (3D) layout of the environment based on the combination of objects and layouts in the structured tree.

In another example, a non-transitory computer readable medium having stored thereon instructions that, when executed by one or more processors, cause the one or more processors to: detect, based on one or more images of an environment and depth information associated with the one or more images, a set of candidate layouts and a set of candidate objects corresponding to the environment; generate a structured tree including nodes corresponding to the set of candidate layouts and the set of candidate objects; select a combination of objects and layouts in the structured tree; and determine a three-dimensional (3D) layout of the environment based on the combination of objects and layouts in the structured tree.

In another example, an apparatus for determining one or more environmental layouts and objects is provided. The apparatus includes: means for detecting, based on one or more images of an environment and depth information associated with the one or more images, a set of candidate layouts and a set of candidate objects corresponding to the environment; means for generating a structured tree including nodes corresponding to the set of candidate layouts and the set of candidate objects; means for selecting a combination of objects and layouts in the structured tree; and means for determining a three-dimensional (3D) layout of the environment based on the combination of objects and layouts in the structured tree.

In some aspects, to select the combination of objects and layouts in the structured tree, the method, apparatuses, and computer-readable medium described above can include performing or can be based on a search of the structured tree using a Monte-Carlo Tree Search (MCTS) algorithm. In some examples, the MCTS algorithm includes an adapted MCTS algorithm, wherein the adapted MCTS algorithm assigns a fitness value to each node searched in the structured tree, the fitness value representing a probability that at least one of an object and layout associated with the node is present in the environment. In some aspects, the method, apparatuses, and computer-readable medium described above can generate a score for each node in the structured tree, the score being based on the adapted MCTS algorithm, the score including a weight assigned for one or more views at each node of the structured tree, an exploration term derived for MCTS, and the fitness value. In some examples, the weight is at least partly based on a view score for the one or more views, the view score for a view defining a consistency measurement between a candidate associated with a node associated with the view and data from the one or more images and the depth information associated with the view.

In some aspects, the set of candidate layouts can include a set of 3D layout models and associated poses, and the set of candidate objects can include a set of 3D object models and associated poses.

In some aspects, the one or more images can include one or more red-green-blue images (RGB) and the depth information can include one or more depth maps of the environment. In some cases, the one or more images and the depth information can include one or more RGB-Depth (RGB-D) images.

In some cases, detecting the set of candidate layouts can include identifying, based on a semantic segmentation of a point cloud associated with the one or more images, 3D points corresponding to at least one of a wall of the environment and a floor of the environment; generating 3D planes based on the 3D points; generating polygons based on intersections between at least some of the 3D planes; and determining layout candidates based on the polygons.

In some aspects, detecting the set of candidate objects can include detecting 3D bounding box proposals for objects in a point cloud generated for the environment; and for each bounding box proposal, retrieve a set of candidate object models from a dataset.

In some cases, the structured tree includes multiple levels, wherein each level includes a different set of incompatible candidates associated with the environment. In some aspects, the different set of incompatible candidates include incompatible objects and/or incompatible layouts. In some cases, two or more candidates from the different set of incompatible candidates are incompatible when the two or more candidates intersect or are not spatial neighbors.

In some aspects, the environment includes a 3D scene.

In some aspects, each candidate of the set of candidate layouts and the set of candidate objects includes a polygon corresponding to intersecting planes. In some cases, the intersecting planes include one or more two-dimensional planes. In some examples, the polygon includes a three-dimensional polygon. In some aspects, the one or more polygons include one or more three-dimensional polygons.

In some aspects, the methods, apparatuses, and computer readable medium described above further comprise detecting one or more planes using a machine learning model.

In some aspects, the methods, apparatuses, and computer readable medium described above further comprise detecting one or more planes using a machine learning model and semantic segmentation.

In some aspects, the method, apparatuses, and computer-readable medium described above can include generating virtual content based on the determined 3D layout of the environment.

In some aspects, the method, apparatuses, and computer-readable medium described above can include sharing (e.g., transmitting, uploading, etc.) the determined 3D layout of the environment with a computing device.

In some aspects, one or more of the apparatuses is, is part of, and/or includes a camera, a mobile device (e.g., a mobile telephone or so-called "smart phone" or other mobile device), a wearable device, an extended reality (XR) device (e.g., a virtual reality (VR) device, an augmented reality (AR) device, or a mixed reality (MR) device), a personal computer, a laptop computer, a server computer, a vehicle or a computing device or component of a vehicle, or other device. In some aspects, the apparatus includes a camera or multiple cameras for capturing one or more images. In some aspects, the apparatus further includes a display for displaying one or more images, notifications, and/or other displayable data. In some aspects, the apparatuses described above can include one or more sensors (e.g., one or more inertial measurement units (IMUs), such as one or more gyrometers, one or more accelerometers, any combination thereof, and/or other sensor).

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

Illustrative embodiments of the present application are described in detail below with reference to the following figures:

FIG. 6A and FIG. 6B are diagrams illustrating examples of proposals that can be selected for a scene, in accordance with some examples;

FIG. 11 is a flowchart illustrating an example of a process of determining one or more environmental layouts and objects, in accordance with some examples.

DETAILED DESCRIPTION

Figure 1A:
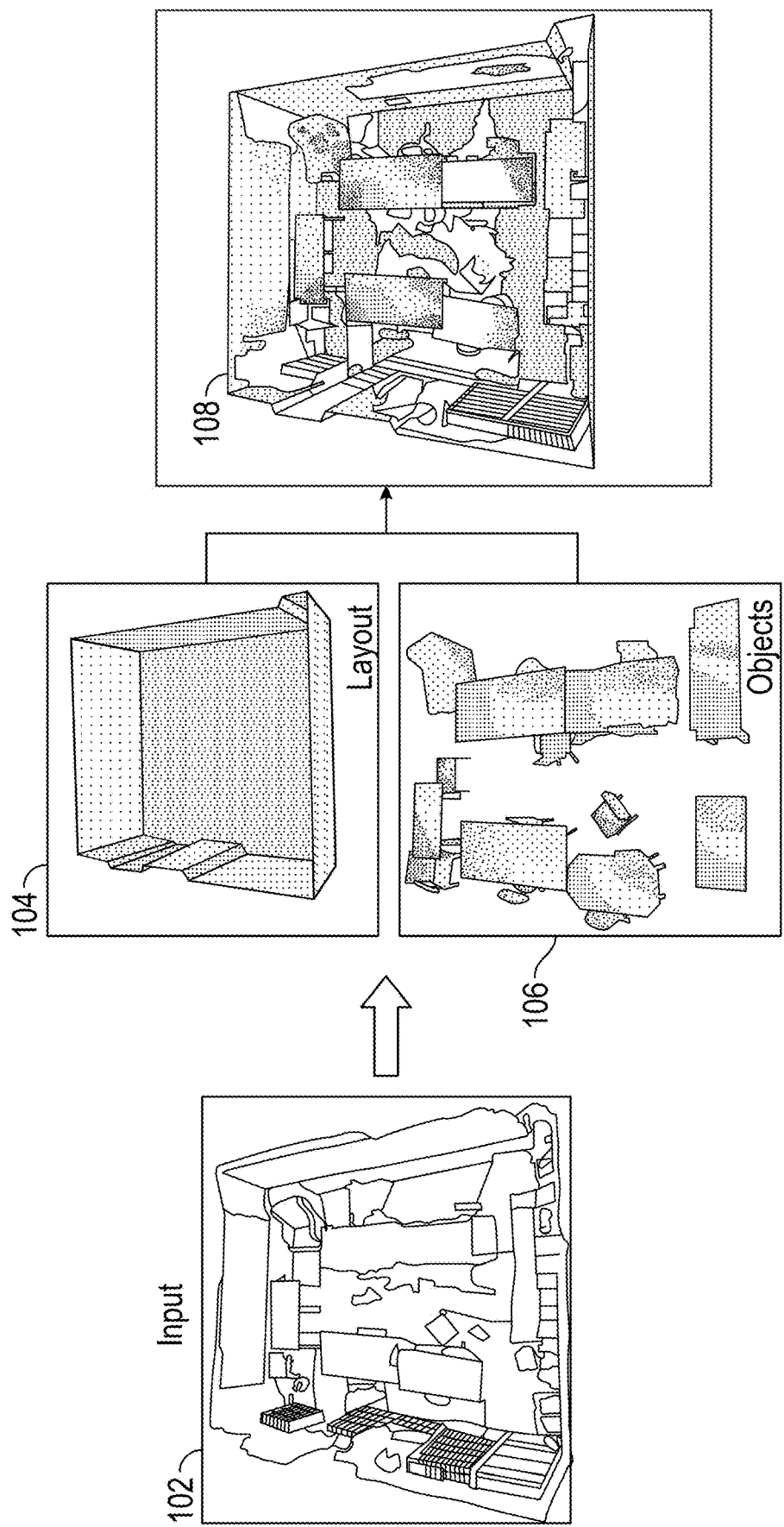
FIG. 1A is a diagram illustrating an example process for generating an estimated three-dimensional (3D) scene from an input image, in accordance with some examples.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the application. However, it will be apparent that various embodiments may be practiced without these specific details. The figures and description are not intended to be restrictive.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the application as set forth in the appended claims.

Systems, apparatuses, processes (also referred to as methods), and computer-readable media (collectively referred to herein as "systems and techniques") are described herein for improved layout and object estimation from one or more images. In one illustrative example, the one or more images can include red-green-blue (RGB) data and depth data, which can in some cases include RGB-depth (RGB-D) images. Other types of images can also be used, such as YUV or YCbCr images (including a luma or luminance component Y and chroma or chrominance components U and V or Cb and Cr per pixel) or other types of images. While examples are described herein using RGB-D images for illustrative purposes, any type of image and depth information associated with the image can be used by the systems and techniques described herein.

In some aspects, an artificial intelligence (AI) algorithm can be used for three-dimensional (3D) scene understanding. In some cases, using the AI algorithm for 3D scene understanding can reduce the need for training data. In some aspects, the AI algorithm used herein can include a Monte Carlo Tree Search (MCTS) algorithm or technique. In some aspects, the AI algorithm used herein can include a modification of the MCTS algorithm or technique. For instance, to perform layout and object estimation efficiently, changes to the standard MCTS tree construction and exploration policy can be made to make MCTS more efficient when handling 3D scenes. The AI algorithm or technique (e.g., MCTS or modified MCTS, etc.) can be used to identify objects and room layouts jointly from images (e.g., noisy red-green-blue (RGB) depth (RGB-D) scans).

In general, MCTS can be used for complex perception problems by casting them into certain applications, such as single-player games. In contrast to graph-based methods for layout recovery, MCTS can optimize any loss. In some cases, the MCTS or modified MCTS techniques described herein can be used to optimize the posterior probability of objects and room layout hypotheses. This results in an analysis-by-synthesis approach, which explores the solution space by generating renderings of scenes with estimated 3D layouts and objects and comparing the renderings to RGB-D images/observations of the scenes.

Analysis-by-synthesis, also referenced to as inverse-rendering or as render-and-compare, is a concept in computer vision for scene understanding from images. By comparing a rendering of a current estimate for the scene representation with the observed images, it may be possible to improve this estimate. The potential of analysis-by-synthesis approaches can be observed by deep learning architectures that exploit this idea by learning to predict a first estimate and an update rule.

Analysis-by-synthesis deep learning approaches can provide better generalizations and need less training data than direct inference methods, as they are able to adapt to the conditions specific to the input images. Some methods are self-supervised or weakly supervised, which can be advantageous because creating annotated 3D training data becomes very cumbersome. However, some methods can be limited to small parts of a scene, and may consider one object at a time. This can be a limiting factor, as real scenes can be very complex, with object occlusions and interactions that are ignored.

As noted above, the systems and techniques described herein can apply MCTS for estimating scene layouts and for estimating placement (e.g., location and pose, etc.) of objects in the scenes. MCTS is a discrete AI algorithm that can be used for one or more applications. In one illustrative example, MCTS can be used for learning to play games. For instance, MCTS can be a component in AlphaGo and AlphaZero, an algorithm that achieves superhuman performance for different two-player games, such as Go and chess. For any given application, it is possible to see perception as a (single-player) game, where the goal is to identify the correct 3D elements that explain the scene. In the absence of supervision for guidance, this identification process in an open world can become a very complex task. In some examples scenes, the search space can have a size of $2^N$, where N has an order of magnitude of 100 to 1000. In such cases, where the search problem can be organized into a tree structure that is too large for exhaustive evaluation, MCTS can be a good option. MCTS can be interrupted at any time to return the best solution found so far, which can be useful for some applications (e.g., robotics applications, extended reality (XR) such as augmented reality or virtual reality, etc.).

MCTS can be used to optimize general loss functions, which do not need to be differentiable losses. A system can thus rely on a loss function derived directly from a Bayesian framework, as in some analysis-by-synthesis approaches. The loss function can compare a rendering (which can be but does not have to be realistic) of an estimate with the input images and can incorporate constraints between the scene elements. This turns MCTS into an analysis-by-synthesis method that explores possible explanations for the observations, possibly backtracking to better explanations when an explanation is not promising. One example advantage of MCTS is that it can focus on the most promising branches, which makes it efficient to find good solutions even for problems with high combinatorial complexity.

In principle, the systems and techniques can apply MCTS (e.g., single-player MCTS) directly to the scene understanding problem, where one action (e.g., one move) can correspond to selecting a proposal. The goal of the MCTS can be to explain the scene by selecting proposals in a sequence. In some cases, using standard MCTS algorithm may not be particularly efficient. Modifications to the standard MCTS algorithm can be made to make the scene understanding solution more efficient in obtaining the correct solution. For example, the solution tree can be structured based on physical constraints between proposals. Proposals farthest from the already selected proposals can be pruned, as well as those proposals that are incompatible with the already-selected proposals, for example if the proposals intersect at least one of them. These modifications to MCTS can significantly speed up the search for the correct solution. Further, while MCTS can prioritize more exploration/exploitation based on the objective score for optimization, a score can be used based on how the proposal improves the solution locally. This improves retrieval of details in the scene structure.

In some cases, the systems and techniques described herein can be related to methods based on graph optimization. These methods rely on objective functions made of unary and binary terms as these functions can be optimized efficiently with graph algorithms. However, this efficiency comes at the price of a less general formalization of the problem. One example advantage of using MCTS is that any objective function can be used. This allows an objective loss to be used that involves all the objects simultaneously instead of a sum over individual objects, and constraints between multiple objects instead of just two.

In some examples, the systems and techniques disclosed herein can determine high quality solutions, which can be more accurate than available manual annotations. One possible use is to use the systems and techniques to automatically generate 3D annotations. In one illustrative example, the 3D annotations can be used to train deep learning methods for fast inference from single images. More generally, the disclosed systems and techniques can lead to new venues for perception problems but also towards an integrated architecture between perception and control. For example, the systems and techniques can apply MCTS or modified MCTS to robot motion planning control, XR-based scene understanding or mapping (e.g., for anchoring virtual objects to objects in a scene, for generating maps, etc.), among others.

In some examples, the systems and techniques can use the room layout estimation (e.g., determined based on the use of MCTS or modified MCTS) to reconstruct the location of layout components, such as walls, floors, and ceilings. In general, the room layout estimation task can be very challenging as layout components are often partially or completely occluded by furniture in the room. Cuboid assumption constrains layouts to be in a shape of a box and may be assumed for single-view room layout estimation. Manhattan assumption is somewhat relaxed prior, and enforces neighboring layout components to be orthogonal to each other. Some example methods that recover layouts from panoramic images and point clouds can rely on such prior.

While such assumptions make the layout estimation task much easier, they considerably limit the amount of layout configurations where such methods can be applied. One way to overcome these annotations is through supervised deep learning. However, large scale datasets are typically limited to either cuboid or Manhattan constraints, and the process of annotating small layout structures can be a tedious one. This makes the problem of making deep learning methods robust to general layouts that much harder.

In contrast to certain point cloud based methods for layout estimation, the disclosed systems and techniques can be applied various types of datasets, such as to incomplete and noisy scans (e.g., scans provided by the ScanNet dataset), as the disclosed approaches can deal with false proposals in render-and-compare fashion, which is difficult to achieve with point cloud data only.

Some layout proposal generation systems are limited to Manhattan layout. For instance, some layout proposal generation systems detect proposals in single-view setting and use a render-and-compare approach to retrieve layout. However, such systems use exhaustive search to find the solution. The scene structure and MCTS based search approach described herein can be utilized to significantly improve efficiency even in such single-view settings.

In some examples, the systems and techniques described herein can be applied for 3D object detection and model retrieval, such as from RGB and depth data. Some examples can predict 3D bounding boxes for multiple objects in a RGB-D image by modelling the object-object relations in a probabilistic framework. In some examples, sliding shapes with handcrafted features can be used to predict 3D bounding boxes from a RGB-D image and later extend it to deep features. Some examples can use Hough voting scheme to generate 3D bounding box proposals from scan point cloud. In some cases, RGB features from one or more views can be combined with features from point cloud or voxel grid of the scene to predict 3D bounding boxes of the object, its objectness score and the category.

One or more classifications of methods can be considered that attempt to jointly reconstruct layout and objects, such as generative methods and discriminative models. Generative models allow for more detailed semantic reasoning of the scene by incorporating several priors. Discriminative models rely on large training data to learn the implicit semantic structure and are known to produce implausible outputs if the input scene is very different from the training scenes.

Analysis-by-synthesis techniques can be used in several generative methods for complete scene reconstruction. Some examples can estimate the room layout under cuboid assumption and optimize the alignment of multiple objects in a scene by minimizing the cosine distance of the convolutional features extracted from the input RGB image and the rendered image. Some examples can organize the 3D scene in a parse graph and formalize the problem as maximizing the likelihood of image and depth data along with prior terms. In some cases, 3D geometric phrases can be used to encode both 3D geometric and contextual interactions among objects. Some examples can encode human-object, object-object and object-layout relations in their prior terms and use variants of Markov Chain Monte Carlo method to search for the optimal layout and object configurations.

While some of the foregoing examples may focus on obtaining accurate object and layout alignments with certain assumptions (e.g., cuboid assumption) for layouts, the systems and techniques described herein can retrieve an optimal model (e.g., an optimal CAD model) for each object from a large pool of proposals and can recover complex layout details without making any assumptions. For instance, in some cases, the systems and techniques can generate proposals for layout components and objects in a single RGB-D image. The systems and techniques can estimate an optimal set of proposals that minimize a fitting cost defined on an image (e.g., an RGB image) and depth information associated with the image (e.g., a depth image or depth information included in the image, such as RGB-D). In some cases, an exemplar-based model retrieval method can be used. For instance, the exemplar-based model retrieval method can be limited by the size of a set of training data and can use a hill-climbing technique to perform optimization, which is prone to local optima and does not scale well to larger search spaces. In some cases, the systems and techniques described herein can use synthetic data to generate a number of object proposals (e.g., several hundred object proposals or in some examples more or less) for a scene (e.g., the entire scene) and can rely on a more structured and optimal search method that can potentially find the global optimum (e.g., even with a large pool of proposals). Such systems and techniques also allow more detailed layouts to be retrieved without making any assumption on layout configurations.

In some cases, discriminative approaches can be limited by the training data, which can be difficult to obtain for complete scenes. Different datasets from simple cuboid representations for objects and layouts to complete CAD model annotations can be used. Synthetic datasets with rich and realistic 3D environments can also be used. Some examples can include generating several 3D bounding box hypotheses for objects and layouts in a panorama image and training a support vector machine (SVM) to rank them holistically. Some examples can include using cooperative loses to jointly estimate bounding boxes for layout and objects in a single RGB image. Some examples can include predicting the canonical voxel representation for objects along with their poses and a depth map for the layout. Some example approaches can estimate a mesh for each object in a single RGB image.

Some examples approaches can include estimating layout and objects from RGB-D scans and following a hierarchical approach to layout estimation by predicting corners, edges and quads, and enforced object-object and object-layout consistency through a proxy loss. In some examples, the systems and techniques described herein can use a combination of a bottom-up approach and a top-down approach where several proposals can be generated for the layout components and objects from the low-level data in a point cloud and explicit reasoning can be used holistically in image and depth data along with physical plausibility constraints to obtain the best subset of proposals that represent or explain the scene.

The systems and techniques can be implemented on a particular dataset (e.g., the ScanNet dataset), which can be used to show that results generated using the systems and techniques outperform other approaches on several object categories. For example, to evaluate how MCTS behaves for 3D scene understanding in realistic conditions, the ScanNet dataset can be considered. The system can aim at retrieving 3D models for the objects (e.g., furniture) in a scene and for the layouts of the scene (e.g., walls, floors, ceilings, etc.). Proposals for possible 3D models can be generated using a point cloud generated from a sequence of images (e.g., a sequence of RGB-D images). MCTS (or modified MCTS) can be applied to determine the combination of proposals that best explains the scene in the sequence of images. In some cases, a comparison between the 3D scene estimates and the point cloud can be performed directly in 3D. However, in some cases, parts of the real scene may be missing from the point cloud. For example, parts of the scene may not be scanned or the RGB-D camera (or other type of image and/or depth sensor) may not return depth values for certain parts of the scene (e.g., parts of the scene corresponding to dark materials, reflective materials, or other parts of the scene). In some cases, the scene estimates can be rendered and compared to the RGB-D frames. This allows the system to exploit both the color and depth information efficiently. The color information can be used to obtain a semantic segmentation of the images and compared with the projected objects' masks, which can avoid the need for realistic rendering.

Based on the analysis with respect to the dataset, the systems and techniques described herein can retrieve configurations that are better than some manual annotations. As noted above, the systems and techniques described can be used to automatically generate 3D annotations. The 3D annotations can be used for various purposes, such as synthetic training input used to train Deep Learning approaches for better (e.g., more efficient, faster, etc.) inference.

An overview of MCTS is provided herein. MCTS is a general algorithm that efficiently solves problems of high complexity that can be formalized as a tree search. MCTS does this by sampling paths throughout the tree and evaluating the scores of these paths. Starting from a tree containing the root node only, this tree is gradually expanded in the most promising directions.

To identify the most promising solutions (e.g., paths from the root node to a leaf node), each node N stores a sum Q(N) of game scores computed during "simulations" and the number of times n(N) it has been visited. A traversal starting from a node can choose to continue with an already visited node with a high score (exploitation) or to try a new node (exploration). As strictly enforcing exploitation would lead to local maxima, MCTS relies on strategies that balance exploitation and exploration. MCTS iterates over multiple tree traversals, each with four consecutive phases performed from the root node, including a Select phase, an Expand phase, a Simulate phase, and an Update phase. These phases are further detailed below. An example of pseudo-code for single-player nonrandom MCTS, which corresponds to an illustrative example problem herein, is given in Algorithm 1 below:

---

Algorithm 1: Generic MCTS for non-random single-player games

```
 1  iters ← Number of desired runs, best_moves ← Ø
 2  while iters > 0 do
 3      N_curr ← N_root
 4      reached_terminal ← False
 5      while not reached_terminal do
 6          N_curr ← SELECT N_curr
 7          if N_curr is visited for the first time then
 8              EXPAND N_curr
 9              best_sim ← sc(Simulate(N_curr, sim))
10              UPDATE(best_sim)
11              if sc(best_sim) > sc(best_moves) then
12                  best_moves ← moves of best_sim
13              reached_terminal ← True
14          else if N_curr is terminal then
15              reached_terminal ← True
16      iters ← iters - 1
17  return best_moves
```

---

Select—This step selects the next node of the tree to traverse among the children of the current node $N_{curr}$. If one or several children have not been visited yet, one of them is selected randomly and MCTS moves to the Expand step. If all the children have been visited at least once, the next node is selected based on some criterion. The most popular criterion to balance exploitation and exploration is the Upper Confidence Bound (UCB) that takes:

$$\arg\max_{N \in C(N_{curr})} \lambda_1 \frac{Q(N)}{n(N)} + \lambda_2 \cdot \sqrt{\frac{\log n(N_{curr})}{n(N)}}, \quad \text{Equation (1)}$$

where $C(N_{curr})$ is the set of children nodes for the current node. In this case, the selected node is assigned to $N_{curr}$, before iterating the Select step. Note that two-player games usually consider the average value rather than the maximum, which is more adapted to one-player games as in our case. This is because a system does not need to account for the uncertainty of a the opponent's moves in single-player games, which makes the game score more reliable.

Expand—This step expands the tree by adding the selected node to the tree, when it is visited for the first time.

Simulate—After adding the new node, many "simulations" are ran to assign a score to it and update the scores of all of the visited nodes over the iteration. Each simulation follows a randomly-chosen path from the new node until a leaf node, e.g., the end of the game.

Update—A simulation score is computed from the simulations. For single-player games, it is usually taken as the score obtained at the end of the game by the best simulation. This score is used to initialize the Q value stored in the new node, and added to the Q of the other nodes selected during the iteration.

The next MCTS iteration will then traverse the tree using the updated scores.

After a chosen number of iterations, in the case of nonrandom single-player games or other applications, the solution returned by the algorithm is the simulation that obtained the best score for the game.

Some example approaches are further described below. In some examples, a formalization is given, along with examples for generating the proposals and examples for adapting MCTS to efficiently retrieve good solutions.

FIG. 1A is a diagram illustrating an example process for generating an estimated 3D scene 108 from an input image 102. The input image 102 can include an RGB-D scan or image of the scene, with red, green, and blue color components and depth information per pixel, or other suitable image. The input image 102 can be used to predict a layout 104 and objects 106 of the scene. In some examples, the scene can include an indoor space. In some examples, one or more RGB-D images can be used to generate a 3D scan (e.g., input image 102), which can be used to predict the layout 104 and objects 106. In some cases, RGB-D scans of an indoor scene can be obtained with visual odometry or simultaneous localization and mapping (SLAM) techniques and RGB-D sensors.

In some examples, the layout can include walls and floors of a space, represented as 3D polygons. Objects can be represented by their 3D models along with their 3D poses (e.g., 3D rotation and 3D translation). In some cases, the 3D scene that is generated can include estimated objects 106 and a layout 104 overlaid on a scene.

In some examples, the processes and techniques described herein can be used to determine 3D components (e.g., 3D layout, objects, etc.) of a room or other environment with a defined structure (e.g., a structure defined by one or more floors, ceilings, walls, and/or other objects). For instance, as described in more detail below, the techniques can detect and/or segment planes of an environment depicted in an input image. In some cases, planes that do not belong to any of certain defined layout components or objects can be discarded. In one illustrative example, planes corresponding to the floor, ceiling, walls, and/or other objects in an environment are kept, while planes corresponding to other objects or components are discarded. In some examples, 3D parameters for the remaining planes can be calculated, and plane intersections are determined based on the parameters. The plane intersections can represent vertices of candidate polygons for the room layout. For instance, corners and edges (or boundaries) can be identified based on the intersections of the planes. The techniques can determine polygons based on the corners and edges. For instance, a search (e.g., an analysis-by-synthesis approach) can be performed to find an optimal set of layout polygons for the image. The 3D layout of the environment can be determined based on the polygons.

In some examples, the processes and techniques described herein can be used for a variety of applications such as, for example and without limitation, augmented reality, robot navigation, autonomous driving, among others.

Figure 1B:
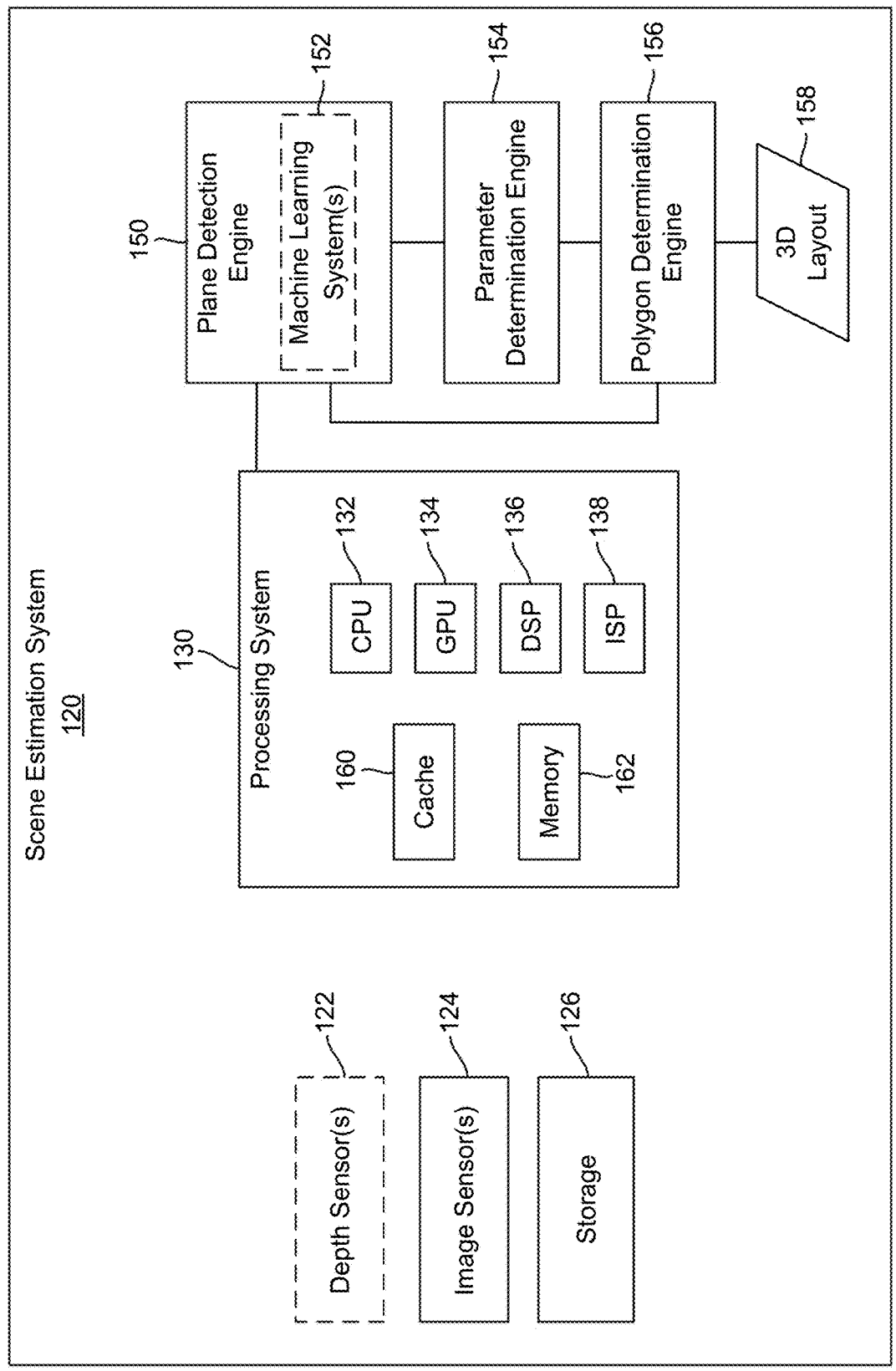
FIG. 1B is a diagram illustrating an example of a scene estimation system, in accordance with some examples.

FIG. 1B is a diagram illustrating an example scene estimation system 120. The scene estimation system 120 includes one or more an image sensors 124, a storage 126, and optional one or more depth sensors 122 (as indicated by the dotted outline shown in FIG. 1B), a processing system 130, a plane detection engine 150, a parameter determination engine 154, and a polygon determination engine 156. In some examples, the plane detection engine 150 include a machine learning system 152, which can include one or more neural networks and/or other machine learning systems.

The processing system 130 can include components including, for example and without limitation, a central processing unit (CPU) 132, a graphics processing unit (GPU) 134, a digital signal processor (DSP) 136, an image signal processor (ISP) 138, a cache memory 160, and/or a memory 162, which the processing system 130 can use to perform one or more of the operations described herein. For example, the CPU 132, the GPU 134, the DSP 136, and/or the ISP 138 can include electronic circuits or other electronic hardware, such as one or more programmable electronic circuits. The CPU 132, the GPU 134, the DSP 136, and/or the ISP 138 can implement or execute computer software, firmware, or any combination thereof, to perform the various operations described herein. The software and/or firmware can include one or more instructions stored on a computer-readable storage medium and executable by one or more processors of the processing system 130. In some cases, one or more of the CPU 132, the GPU 134, the DSP 136, and/or the ISP 138 can implement the plane detection engine 150, the parameter determination engine 154, and/or the polygon determination engine 156. It should be noted that, in some examples, the processing system 130 implement one or more computing engines that are not shown in FIG. 1B. The plane detection engine 150, the parameter determination engine 154, and the polygon determination engine 156 are provided herein for illustration and explanation purposes, and other possible computing engines are not shown for the sake of simplicity.

The scene estimation system 120 can be part of, or implemented by, a computing device or multiple computing devices. In some examples, the scene estimation system 120 can be part of an electronic device (or devices) such as a mobile device (e.g., a smartphone, a cellular telephone, or other mobile device), a camera system or device (e.g., a digital camera, a camera phone, a video phone, an IP camera, a video camera, a security camera, or other camera system or device), a laptop or notebook computer, a tablet computer, a set-top box, a television, a display device, a digital media player, a gaming console, a video streaming device, an extended reality device (e.g., a head-mounted display (HMD) for rendering virtual reality (VR), augmented reality (AR), and/or mixed reality (MR), AR glasses, or other extended reality device), a heads-up display (HUD), a drone, a computer system in a vehicle (e.g., an autonomous vehicle or a human-driven vehicle), an Internet-of-Things (IoT) device, a smart wearable device, or any other suitable electronic device(s).

In some implementations, the one or more depth sensors 122, the image sensor 124, the storage 126, the processing system 130, the plane detection engine 150, the parameter determination engine 154, and the polygon determination engine 156 can be part of the same computing device. For example, in some cases, the one or more depth sensors 122, the image sensor 124, the storage 126, the processing system 130, the plane detection engine 150, the parameter determination engine 154, and the polygon determination engine 156 can be integrated into a camera, smartphone, laptop, tablet computer, smart wearable device, HMD, AR glasses, IoT device, gaming system, and/or any other computing device. However, in some implementations, one or more of the depth sensor 122, the image sensor 124, the storage 126, the processing system 130, the plane detection engine 150, the parameter determination engine 154, and the polygon determination engine 156 can be part of, or implemented by, two or more separate computing devices.

The scene estimation system 120 can provide an improved approach to estimating the 3D layout of an environment. For example, the scene estimation system 120 can use MCTS or adapted MCTS for scene understanding, as further described herein. As another example, instead of detecting corners (like in RoomNet) or boundaries, the plane detection engine 150 can detect planes in an environment. In some cases, 3D parameters of planes for certain layout components or objects in an environment (e.g., planes detected for the floor, the ceiling, and walls of a room) can be obtained or determined by the parameter determination engine 154. For example, in some cases, the parameter determination engine 154 can use depth information to determine 3D parameters of the planes for the layout components or objects in the environment. In some examples, the 3D parameters of a plane can include the normal vector (also referred to as the surface normal) of the plane and a plane offset indicating a distance of the plane from the camera center that captured the image. The corners and the boundaries can be recovered by computing the intersections of the planes. Annotations for 3D plane detection are plentiful (as compared to room layout annotations), providing the ability to train a method to perform high quality and accurate plane detection. In some cases, the method can include a geometric method. In other examples, the method can include a machine learning algorithm or model (e.g., a neural network).

In some cases, the scene estimation system 120 can use 3D planes as primary geometric entities. In some examples, the scene estimation system 120 can infer the 3D planes of the layout from an RGB-D scan obtained from data from one or more RGB-D sensors, such as image sensor 124. An algorithm is introduced herein, which can be implemented by the polygon determination engine 156 to create the 2D polygons that constitute the 2D layout of the environment. By joining the information from 2D polygons and 3D planes, a final 3D polygon is obtained or determined by the polygon determination engine 156. Moreover, an algorithm herein can perform an MTCS of a tree structure to predict the layout and objects of a scene from one or more RGB-D images.

Machine learning can be used (e.g., by the machine learning system 152 of the plane detection engine 150) to reason about the image contents by identifying planar regions that belong to one of a defined set of semantic classes of the layout (e.g., a "wall" class corresponding to a wall, "floor" class corresponding to a floor, and a "ceiling" corresponding to a ceiling). The amount of annotated data for general room layout estimation, in particular for 3D layout estimation, can be very limited. However, datasets available can be used for training semantic segmentation machine learning models (e.g., neural networks) for indoor environments, and the data for training planar region detection can be obtained automatically in some cases. In some examples, the planar regions (in 2D or 3D) can be identified by applying a machine learning model (e.g., a convolutional neural network or other neural network model) of the machine learning system 152 as a planar region detector. For example, plane detection and semantic segmentation can be performed by the machine learning system 152 using one or more CNNs to label planar regions into the defined set of semantic classes or categories (e.g., walls, floors, and a ceiling). One illustrative example of a neural network model that can be used as a planar region detector is PlaneRCNN, described in Chen Liu, et al. "PlaneRCNN: 3D Plane Detection and Reconstruction from a Single Image," in CVPR, 2019, which is hereby incorporated by reference in its entirety and for all purposes.

In some examples, a 3D object detector can be implemented using a Votenet as described in Qi, Charles R and Litany, Or and He, Kaiming and Guibas, Leonidas J, "Deep Hough Voting for 3D Object Detection in Point Clouds", which is incorporated herein by reference in its entirety and for all purposes.

In some examples, depth information can be obtained, and can be used by the parameter determination engine 154 for the calculation of parameters (e.g., 3D parameters) of the layout planes determined by the plane detection engine 150. As noted above, the parameters of a plane can include a normal vector of the plane (e.g., a vector orthogonal to the plane) and/or a plane offset of the plane. The depth information can be inferred from a color image using machine learning techniques, or can be obtained from the one or more depth sensors 122 (e.g., represented in one or more RGB-D images) which can provide reliable information. A geometric reasoning process can be performed and can include finding plane intersections to construct hypotheses for room layouts in 3D, which can be verified and refined. For instance, the corners and edges for the 3D room layout can be determined by intersecting the 3D layout planes. The techniques described herein are applicable to various types of environments with a defined structure (e.g., a structure defined by one or more floors, ceilings, walls, and/or other objects), such as general room layouts. The layout estimation techniques described herein are not limited to box-like layouts, as is the case for a number of the approaches discussed above.

As not every intersection is a valid layout corner, combining "candidate" edges can result in multiple possible polygons for every layout plane. The final set of polygons for the layout planes is the one that minimizes discrepancy in 3D, comparing to extracted depth information, and in 2D, maximizing the overlap of polygons with corresponding planar regions of the layout.

The layout estimation techniques described herein allow room (or other environment) layout edges and corners, which are not directly visible in the image (e.g. they are obstructed by furniture), to be recovered. The 3D layout 158 can include a final room layout in 3D that is modeled as a set of 3D planes and corresponding polygons (e.g., after a verification and refinement stage). Such a representation allows for efficient 3D visualization and generation of floor plans, among other uses.

In some aspects of an example formalization, given a set $I=\{I_i, D_i\}_{i=1}^{N_v}$ of $N_v$ registered RGB images and depth maps of a 3D scene, the scene estimation system 120 can determine 3D models and their poses for the objects and walls (and/or other structures) that constitute the 3D scene. This can be done by looking for a set of objects and walls (and/or other structures) that maximize the posterior probability given the observations in I:

$$\hat{O} = \underset{o}{\mathrm{argmax}}\, P(O \mid I) = \underset{o}{\mathrm{argmax}} \log P(O \mid I). \quad \text{Equation (2)}$$

Using standard derivations and assumptions, the scene estimation system 120 can determine the following:

$$\log P(O \mid I) \propto \log P(I \mid O)P(O) = \quad \text{Equation (3)}$$

$$\log \prod_i P(I_i \mid O)P(D_i \mid O)P(O) =$$

-continued
$$\sum_i \log P(I_i \mid O) + \sum_i \log P(D_i \mid O) + \log P(O).$$

$P(I_i|O)$ and $P(D_i|O)$ are the likelihoods of the observations. To evaluate $P(I_i|O)$, the scene estimation system 120 can perform a semantic segmentation of images $I_i$ to obtain segmentation confidence maps $S_i(c)$ for each class c. In some cases, the scene estimation system 120 can use $c \in$ {wall, floor, chair, table, sofa, bed} and can obtain rendered segmentation maps $S_i^R$ of the proposals in O from the points of view of the RGB-D images. In one illustrative example, the likelihood term of the RGB data (or other image data) can be defined as:

$$\log P(I_i \mid O) = \lambda_S \sum_c S_i(c) \cdot 1(S_i^R, c) + C_S, \qquad \text{Equation (4)}$$

where $1(S_i^R, c)$ is 1 for rendered pixels in $S_i^R$ that belong to class c and 0 otherwise. $C_S$ is a constant that does not influence the optimisation problem. Note that replacing $S_i(c)$ by $\log S_i(c)$ in Equation 4 would make it the cross-entropy of $S_i(c)$ and $S_i^R$. However, removing the log operation makes it more robust to segmentation errors, as in the combinations of classifiers in ensemble methods.

Similarly, depth maps $D_i^R$ of the proposals can be rendered in O from the points of view of the RGB-D images. The scene estimation system 120 can compare them to the captured depth maps $D_i$ as follows:

$$\log P(D_i|O) = -\lambda_{D,1}|D_i - D_i^R| + C_D. \qquad \text{Equation (5)}$$

Figure 2A:
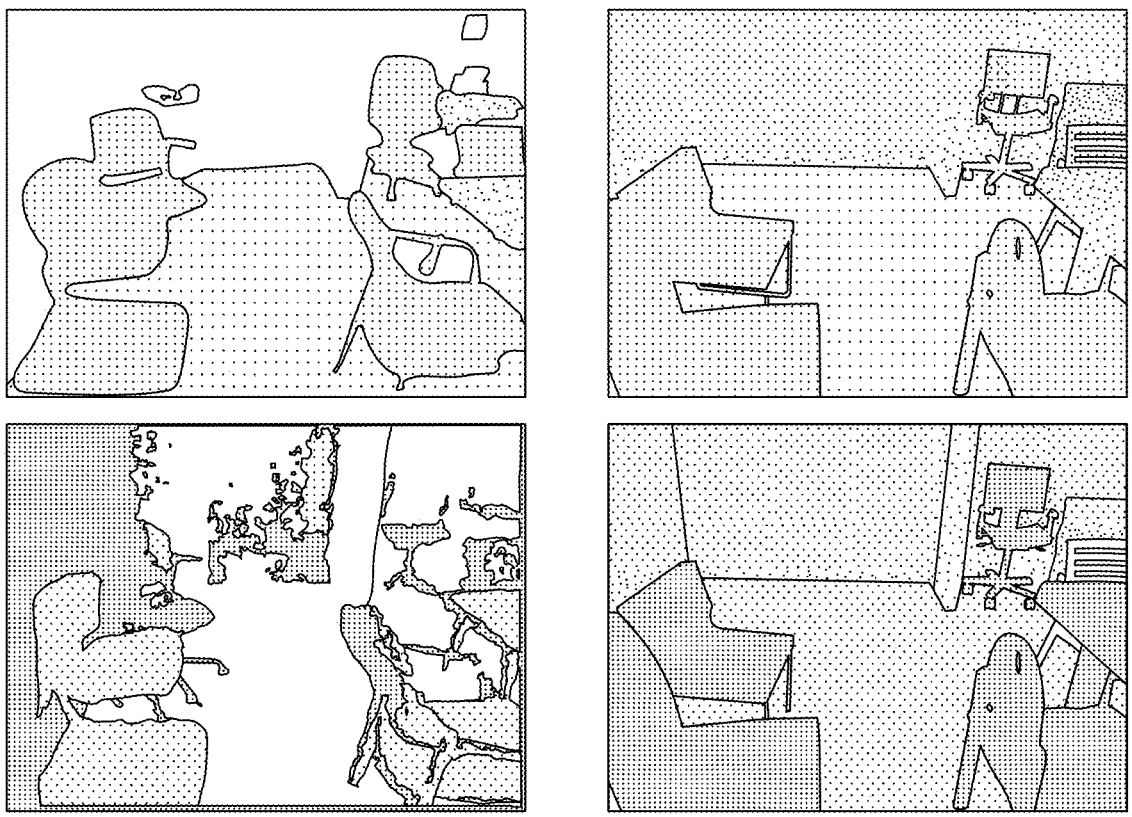
FIG. 2A are images illustrating examples of segmentation maps and depth maps, in accordance with some examples.

As noted above, $C_D$ is a constant that does not influence the result of the optimization. FIG. 2A is a diagram illustrating examples for corresponding $S_i$ (top-left image), $S_i^R$ (top-right image), $D_i$ (bottom-left image), and $D_i^R$ (bottom-right image). Note that an example approach considers all the objects together and takes into account the occlusions that may occur between them.

P(O) is a prior term on the set of proposals O. This can be used to prevent physically impossible solutions. In practice, the proposals may not be perfectly localized and some intersections can be tolerated. When the Intersection-Over-Union (IoU) between two objects is smaller than a threshold, the scene estimation system 120 may tolerate the intersection but still may penalize it. For example, the system can take:

$$\log P(O) = -\lambda_p \sum_{j \neq k, O_j, O_k \in O} IoU(O_j, O_k) + C_p, \qquad \text{Equation (6)}$$

where IoU is the intersection-over-Union between the 3D models for objects $O_j$ and $O_k$. In some examples, a voxel representation of the 3D models can be used to compute it. When the Intersection-over-Union between two object proposals is above this threshold, P(O)=0 can be taken, e.g., the two proposals can be incompatible. In one illustrative example, a threshold of 0.3 can be used. In other examples, other thresholds can be used.

Figure 6A:
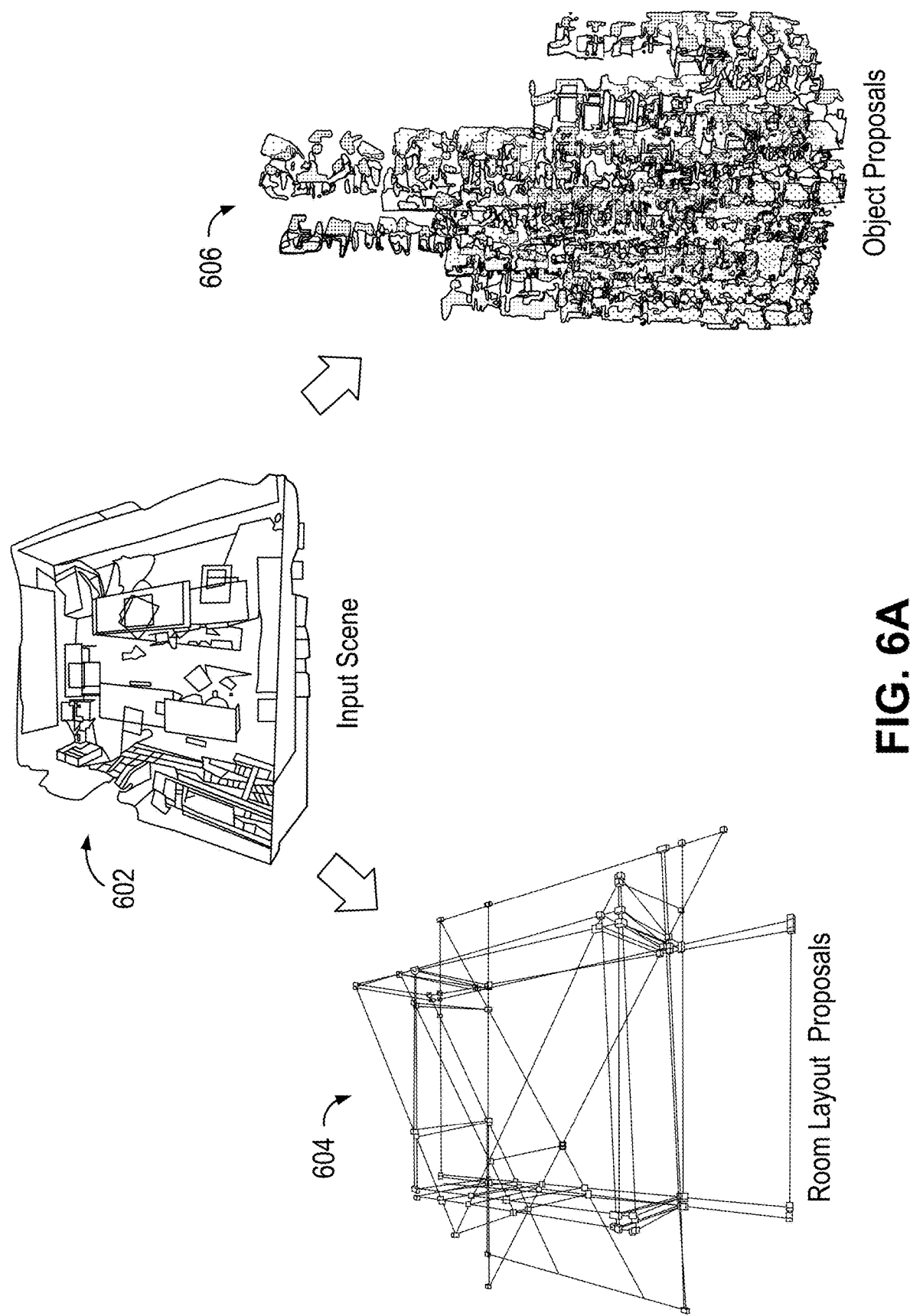

In some cases, this may not be true, such as in chair-table and sofa-table intersections. In these cases, the horizontal surface on which the intersection occurs (e.g., surface of the table, seat of the sofa) can be first identified. The amount of intersection can be determined by calculating the distance of the intersecting point to nearest edge of the horizontal surface. The amount of intersection can be normalized by the dimension of the horizontal surface and a ratio more than the threshold (e.g., 0.3) can be considered incompatible. FIG. 6A and FIG. 6B illustrate an example of object and layout proposals created for a scene, and are described below.

When two layout proposals intersect or when a layout proposal and an object proposal intersect, P(O)=0 can also be taken. In contrast to object proposals where small intersections are still tolerated, intersections for the layout proposals may not be tolerated as their locations tend to be predicted more accurately.

To enforce structured layouts, a certain value, such as 0.1, can be added to the score if layout components in O build a ring.

As previously discussed, to find a set $\hat{O}$ that maximizes Equation 2, an example can start with a pool $O_{pool}$ of proposals that are possibly in the scene, and $\hat{O}$ can be selected as the subset of $O_{pool}$ that maximizes Equation 2. Equation 2 can then be written more explicitly as follows:

$$\hat{O} = \arg\max_{O \subset O_{pool}} sc(O), \qquad \text{Equation (7)}$$

$$\text{with } sc(O) = \sum_I s_i(O) + \lambda_p s^P(O), \text{ and} \qquad \text{Equation (8)}$$

$$s_i(O) = \lambda_I \sum_c S_i(c) \cdot 1(S_i^R, c) - \lambda_D |D_i - D_i^R|, \qquad \text{Equation (9)}$$

$$s^P(O) = -\sum_{O, O' \in O, O \neq O^i} IoU(O, O'). \qquad \text{Equation (10)}$$

An example for generating $O_{pool}$ and maximizing Equation 2 is further described below.

In some examples, to generate proposals, various techniques can be used for generating set of proposals $O_{pool}$, such as one to generate object proposals and a different one to generate walls and floors proposals. FIGS. 6A and 6B show example proposals generated for an example scene.

Each object proposal can be made of a 3D model and its 6D pose, possibly corresponding to an object present in the scene. The 3D models can be CAD models from the ShapeNet dataset described in Angel X. Chang, Thomas A. Funkhouser, Leonidas J. Guibas, Pat Hanrahan, Qi-Xing Huang, Zimo Li, Silvio Savarese, Manolis Savva, Shuran Song, Hao Su, Jianxiong Xiao, Li Yi, and Fisher Yu, "ShapeNet: An Information-Rich 3D Model Repository", CoRR, abs/1512.03012, 2015, which is incorporated herein by reference in its entirety and for all purposes. In some examples, VoteNet can be used to detect 3D objects and MinkowskiNet can be used to extract their point clouds. A VoteNet is describe in Charles R Qi, Or Litany, Kaiming He, and Leonidas J Guibas, "Deep hough voting for 3d object detection in point clouds", In *Int. Conf. Comput. Vis.*, 2019, which is incorporated herein by reference in its entirety and for all purposes. A MinkowskiNet is described in Choy, Christopher, JunYoung Gwak, and Silvio Savarese, "4D Spatio-Temporal Convnets: Minkowski convolutional neural networks", which is incorporated herein by referenced in its entirety and for all purposes.

VoteNet provides the category of the object for each 3D bounding box detection and the system 120 can keep the 3D points in the bounding box classified as belonging to the same category according to MinkowskiNet. A network can be trained based on PointNet++ to predict an embedding for the CAD model and a 6D pose+scale from this point cloud. PointNet++ is described in Charles R Qi, Li Yi, Hao Su, and Leonidas J Guibas. Point-Net++: Deep Hierarchical Feature Learning on Point Sets in a Metric Space. arXiv preprint arXiv: 1706.02413, 2017, which is incorporated herein by reference in its entirety and for all purposes. Sampling the input point cloud differently results in slightly different embeddings corresponding to different CAD models in ShapeNet, and a proposal can be generated with each of these CAD models. The network can be trained using synthetic point clouds generated from the CAD models in ShapeNet. The pose and scale estimates can be refined by performing a small grid search around the predicted values using the Chamfer distance between the CAD model and the point cloud.

Each layout proposal can be represented as a 3D polygon, possibly corresponding to a wall or a floor in the scene (ceilings are usually not visible in ScanNet). Given the point cloud of the scene, MinkowskiNet can be used to segment points belonging to the layout (floor, wall) from the rest of the points. Then, a RANSAC procedure can be used to obtain the parameters of planes that fit the point cloud. Intersections can be computed between these planes to generate the 3D polygons. The planes of the point cloud's 3D bounding box faces can be included to handle occasional incomplete scans, e.g., long corridors may not be scanned completely in the entire length for the ScanNet dataset.

Below are examples of how MCTS can be adapted to perform an efficient optimization of the problem in Equation 3. This variant is also referenced herein as "Monte Carlo Scene Search" (MCSS).

In the case of MCTS, the search tree follows directly from the rules of the game. The search tree explored by MCSS can be defined to adapt to the scene understanding problem and to allow an efficient exploration as follows.

Each proposal P can be assigned a fitness value obtained by evaluating the scoring function in Equation 3 on the pixel locations in each view where the proposal is rendered. Note that this fitness is associated to a proposal and not a node. The fitness will guide both the definition and the exploration of the search tree.

Except for the root node, anode N in the scene tree is associated with a proposal P(N) from the pool $O_{pool}$. Each path from the root node to a leaf node thus corresponds to a set of proposals O that is a potential solution to Equation 3.

The tree can be defined so that no path can correspond to an impossible solution, e.g., to a set O with P(O). This avoids exploring branches that do not correspond to possible solutions. Considering first proposals that are close spatially to proposals in a current path can significantly speed up the search. The tree can be organized by spatial neighborhood. The child nodes of the root node are a node containing the proposal O with the highest fitness among all proposals; the other nodes contain the proposals incompatible with proposal O and incompatible with each other.

To define the children of every other node N, the system 120 can consider the set H made of the proposal in N and the proposals in all its ancestors, and the set $O_{comp}$ of proposals that are not in but compatible with it. The child nodes of N are then: a node containing the closest (in terms of spatial distance) proposal O to the proposal in N; the other nodes contain the proposals incompatible with the proposals in H∪{O}, and incompatible with each other.

Two layout proposals are considered incompatible if they intersect or are not spatial neighbors. They are spatial neighbors if they share an edge and are not on the same 3D plane. In order to account for missing proposals, a special node can be added that does not contain a proposal to deal with the case when none of the other children is part of the final solution.

A scene tree is built by connecting a "layout tree" and "object trees". Every leaf node of the layout tree is the root node of an object tree.

In some cases, the layout tree can be first searched only for a given amount of iterations. After that, the layout tree is frozen, and the best path in the tree is used as the root node of the object tree.

In some cases, Q in the UCB criterion given in Equation 1 and stored in each node can be taken as the sum of game final scores obtained after visiting the node. Exploration may be more efficient if Q focuses more on views where the proposal in the node is visible.

In MCSS, the score s added to Q of a node containing a proposal O, after a simulation returning solution O is calculated as follows:

$$s = \frac{1}{\sum_i w_i(O)} \sum_i w_i(O) s_i(O) + \lambda_p s^P(O, O),\quad \text{Equation (11)}$$

where $w_i(O)=1$ if O is visible in view i and 0 otherwise, and $$s^P(O, O) = - \sum_{O' \in O, O \neq O'} IoU(O, O'). \quad \text{Equation (12)}$$

MCSS can modify the UCB criterion given by Equation 1 into:

$$N_{child} \leftarrow \arg\max_{N \in C(N_{curr})} \lambda_1 \frac{Q(N)}{n(N)} + \lambda_2 \cdot \sqrt{\frac{\log n(N_{curr})}{n(N)}} + \lambda_3^{n(N)} \text{fitness}(P(N)) \quad \text{Equation (13)}$$

where the first two terms make the standard UCB selection criterion. The third term encourages the exploration of more promising candidates, with a weight that decreases when the number of visits increases. Recall that fitness is related to the proposal, not the node. Visiting a node containing some proposal will therefore influence the selection of nodes containing the same proposal.

In some experiments, it can be empirically found that setting $\lambda_1=1$, $\lambda_2=0.3$, $\lambda_3=0.99$ to be efficient in general. Hence, the fitness term initially plays a role at the beginning but looses importance with higher number of simulations.

As the scoring function is deterministic, in the Select step each path from root to leaf can be visited at most once during search to prevent unnecessary iterations.

Each time (in some cases every time) including a component $O_j$ in a candidate solution reaches the new maximum score for any of the views where $O_j$ is visible, its fitness can be increased by a certain amount such as, for example, by 0.1. If the average score for these views is very low, the fitness can be decreased by an amount such as, for example, by 0.01. For example, if the average score for these views is lower than 0.5 of the average of the best scores achieved for these views so far, the fitness can be decreased by an amount such as, for example, by 0.01. By doing so, the information from all the nodes containing this proposal can be propagated. Visiting a node containing some proposal will therefore influence the selection of nodes containing the same proposal.

MCSS can run the same pseudocode as MCTS as given in Algorithm 1, but may return as a result the best set of proposals found by the simulations according to sc(.) given in Equation 7.

Figures 2B, 2C, 2D:
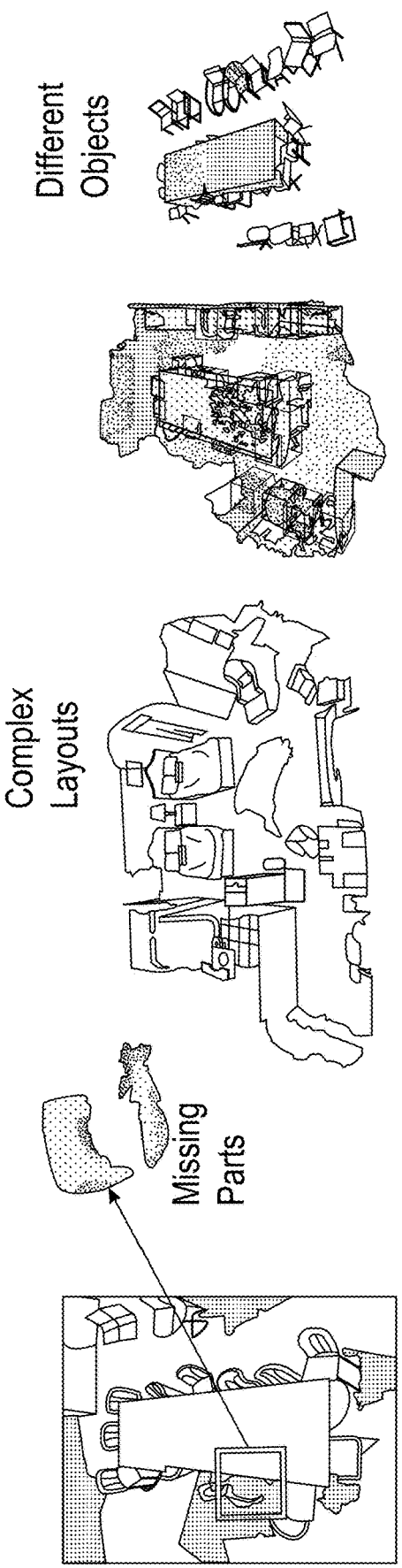
FIGS. 2B through 2D illustrate various example challenges with red-green-blue (RGB)-depth (RGB-D) scans and 3D models, in accordance with some examples.

FIGS. 2B through 2D illustrate various challenges with RGB-D scans and 3D models. As shown in FIG. 2B, in some cases, RGB-D scans may be incomplete e.g., (some parts of the scene are missing). In some cases, RGB-D scans can have many holes (e.g., parts of the walls, floors, objects are missing), because of occlusions, specularities, etc.

As shown in FIG. 2C, in some cases, the layout can be complex (e.g., "non-cuboids", possibly multiple rooms, etc.); In many cases, the scene can have different objects and the 3D models of objects may not be known in advance. Moreover, there is often no annotated dataset available for supervised learning.

Figure 3:
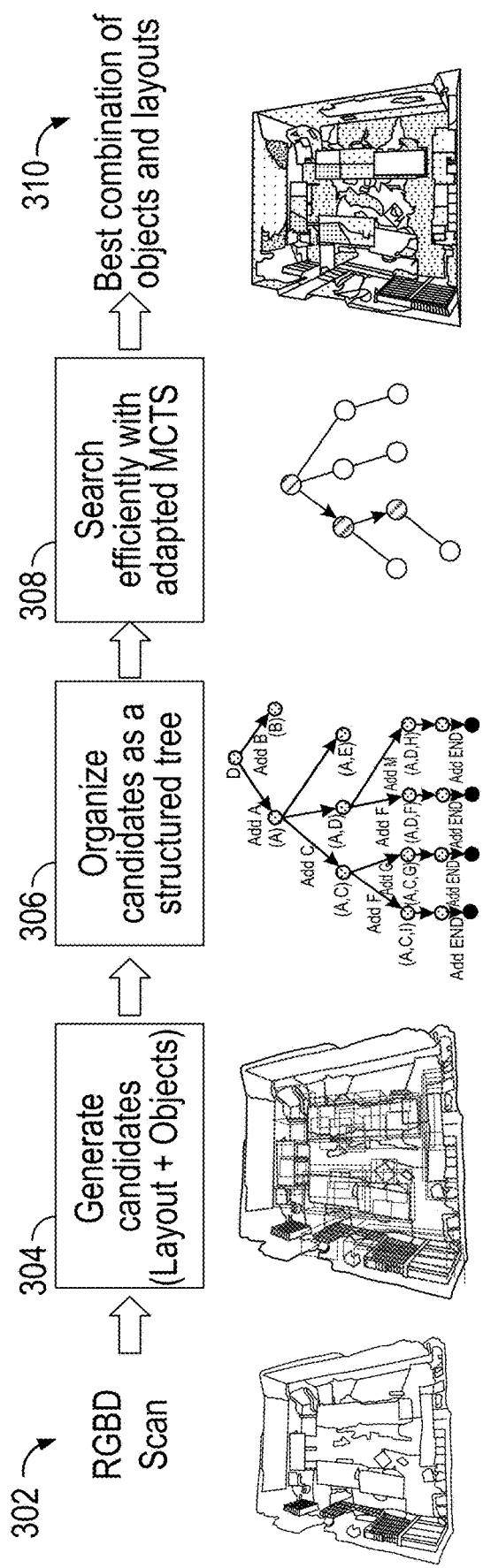
FIG. 3 is a diagram illustrating an example process for a structured-tree search approach for understanding a 3D scene, in accordance with some examples.

FIG. 3 is a diagram illustrating an example process for a structured-tree search approach for understanding a 3D scene, in accordance with some examples. As shown, an RGB-D image 302 can be used to generate 304 one or more candidate proposals. The candidate proposals can include object, walls, floors, and/or layout candidate proposals.

The one or more candidate proposals can be organized 306 as a structured tree. An adapted Monte-Carlo Tree Search (MCTS) can be used to search 308 efficiently the structured tree and find 310 the optimal set of candidates that best correspond to the actual scene based on an objective function.

In some examples, the scene understanding problem can be cast as a structured-tree search, which can include generating object, wall, floor candidate proposals, organizing organize candidate selection into a structured tree, adapting the Monte-Carlo Tree Search (MCTS) method to efficiently search the tree and find the optimal set of candidates that best correspond to the actual scene based on an objective function, as previously described.

MCTS can be used for 3D scene understanding. In other scenarios, MCTS can be used to make computers play single-player or multi-player games (e.g., Chess, Go, Sokoban, etc.). The technologies herein can be used to create the structured tree, and apply MCTS to solve the 3D scene understanding problem. The technologies herein can be used to modify MCTS to speed up the search for the 3D scene understanding problem.

Figure 4:
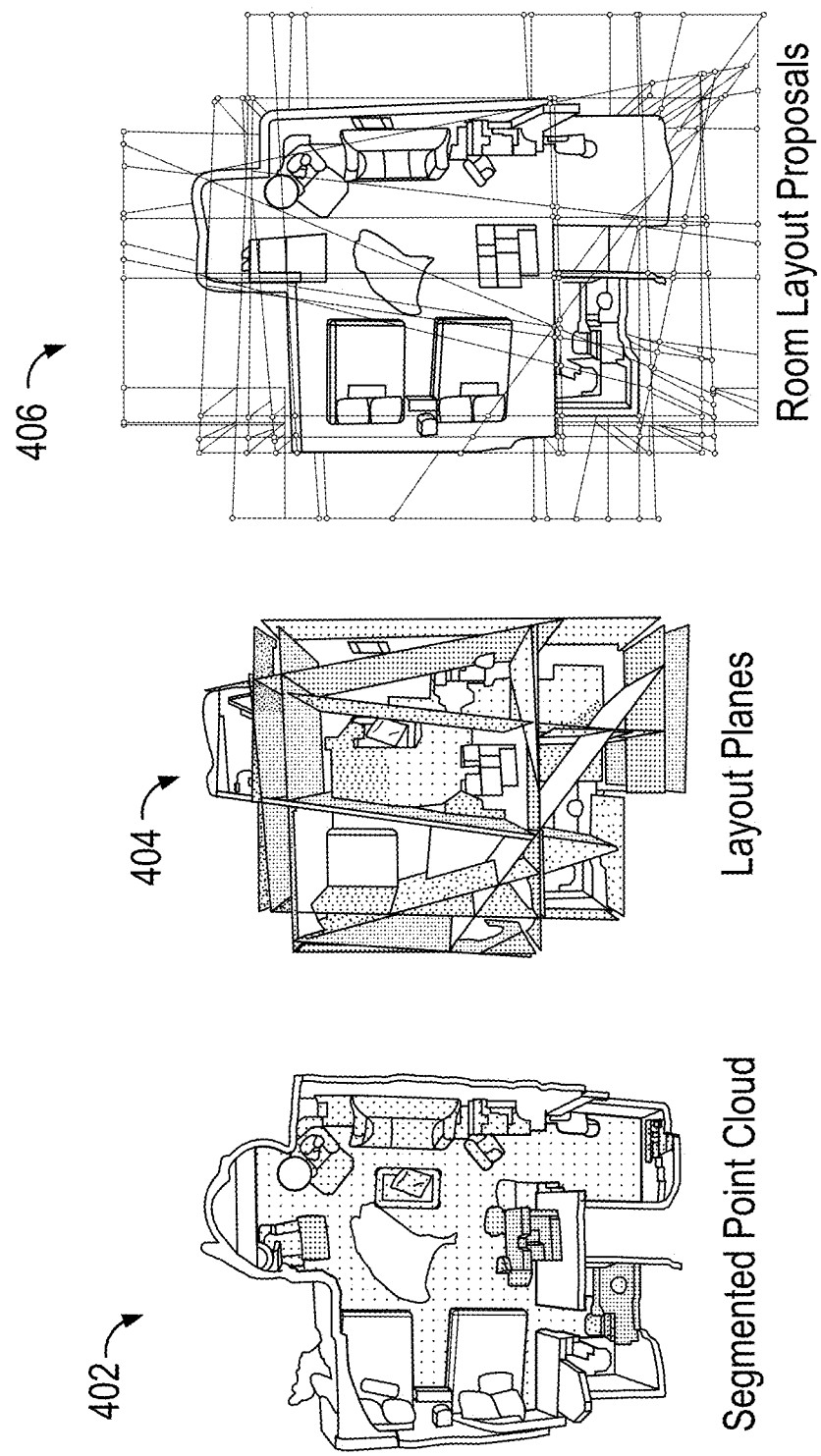
FIG. 4 is a diagram illustrating an example process for generating room layout proposals, in accordance with some examples.

FIG. 4 is a diagram illustrating an example process for generating room layout proposals. In some example, semantic segmentation can be performed on an input point cloud (e.g., using MinkowskiNet, etc.) to generated a segmented point cloud 402. The segmented point cloud 402 can be used to find the 3D points that belong to a wall, a floor, etc. Layout planes 404 (e.g., 3D planes) can then be fit to the 3D points found based on the segmented point cloud 402. Room layout proposals 406 can be obtained as polygons generated from the intersections between the layout planes 404.

Figure 5:
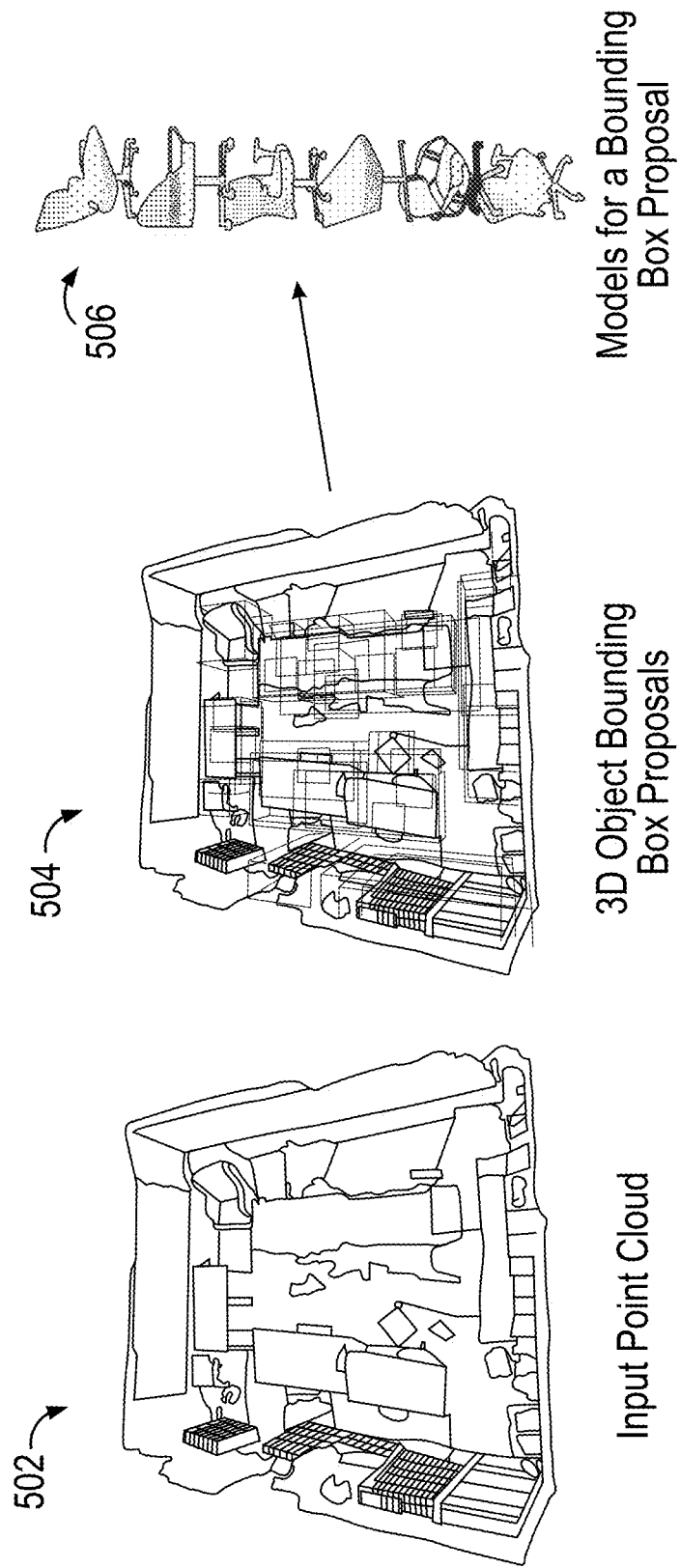
FIG. 5 is a diagram illustrating an example for object proposals generation, in accordance with some examples.

FIG. 5 is a diagram illustrating an example for object proposals generation. In some examples, a 3D object detector can be used to obtain 3D bounding box proposals 504 for objects in an input point cloud 502 of a scene. In some examples, the 3D object detector can include a Votenet as described by Qi, Charles R and Litany, Or and He, Kaiming and Guibas, Leonidas J, "Deep Hough Voting for 3D Object Detection in Point Clouds", which is incorporated herein by reference in its entirety and for all purposes.

For each bounding box proposal, a set of candidate object models 506 can be retrieved from a dataset, such as the ShapeNet dataset. In some examples, a deep network can be trained to retrieve object models. The deep network can be trained with a dataset of synthetic point clouds which contain annotations.

FIG. 6A and FIG. 6B are diagrams illustrating an example for selecting proposals for a scene 602. As shown in FIG. 6A, the proposals can include room layout proposals 604 and object proposals 606, as previously described. FIG. 6B shows the object proposals 604 overlaid over the scene 602 based on the room layout proposals 604.

Figure 7:
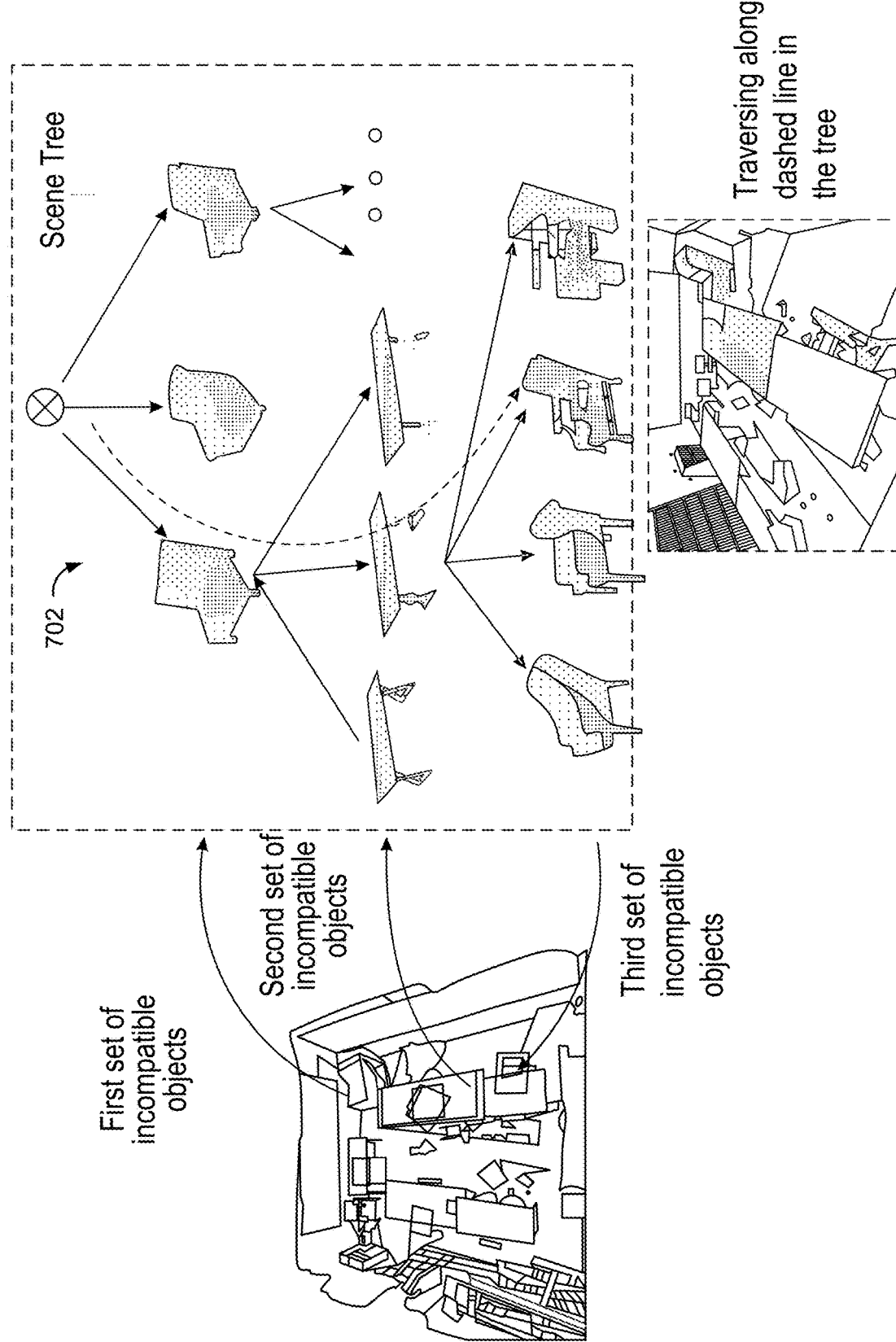
FIG. 7 shows a scene tree structure (also referred to as a structured tree) generated in accordance with some examples.

FIG. 7 shows a scene tree structure generated in accordance with some examples. A scene tree 702 can be defined with different sets of incompatible objects. Each set of incompatible objects is assigned to a level in the scene tree 702. In some examples, the scene tree 702 can be generated based on a first set of incompatible objects, a second set of incompatible objects, and a third set of incompatible objects. In some examples, incompatible objects can include proposals that cannot be in the correct solution together, for example, if they intersect.

Figure 8:
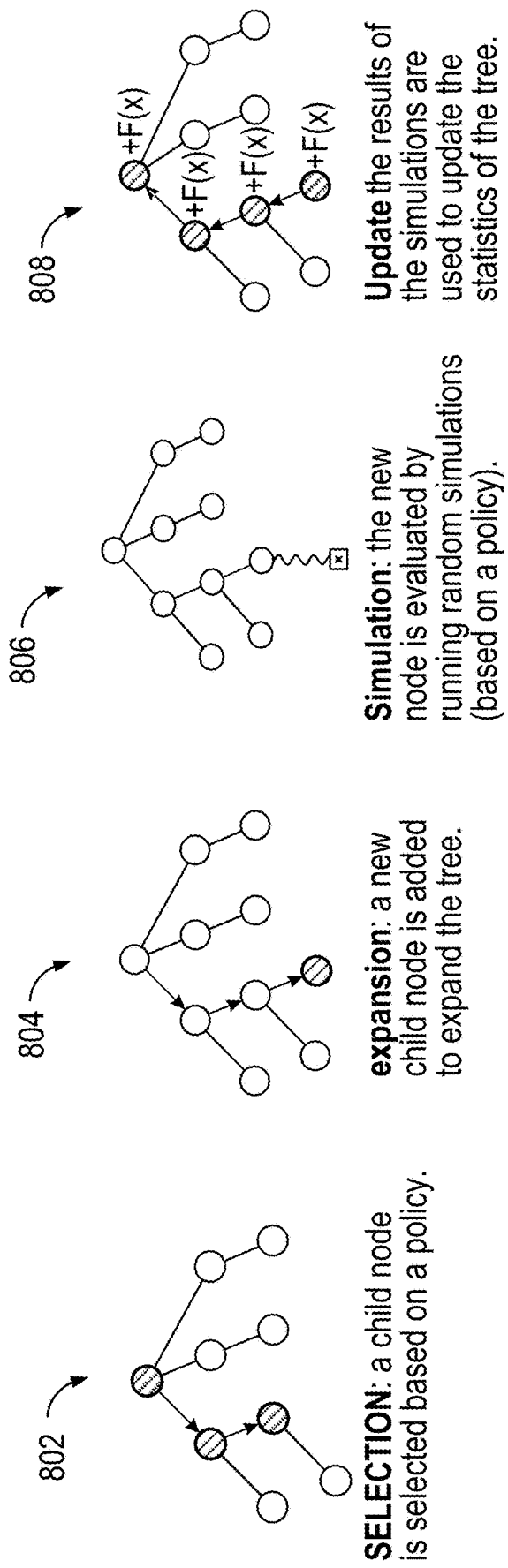
FIG. 8 is a diagram illustrating example Monte Carlo Tree Search (MCTS) operations for finding candidate representations in a structured tree, in accordance with some examples.
Figure 9A:
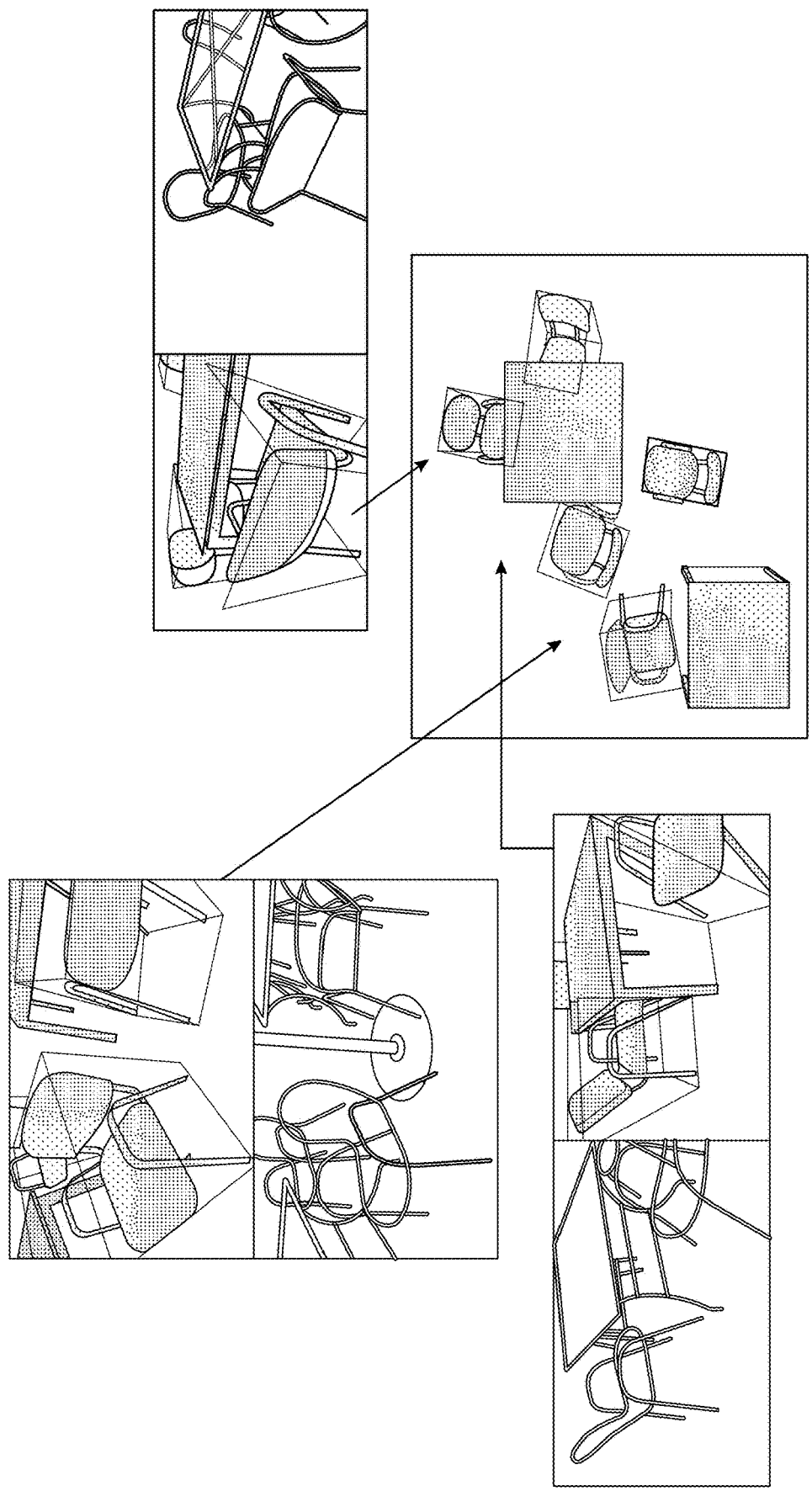
FIGS. 9A through 9E illustrate example results from an adapted algorithm based on MCTS used to efficiently search a scene tree, in accordance with some examples.
Figure 9B:
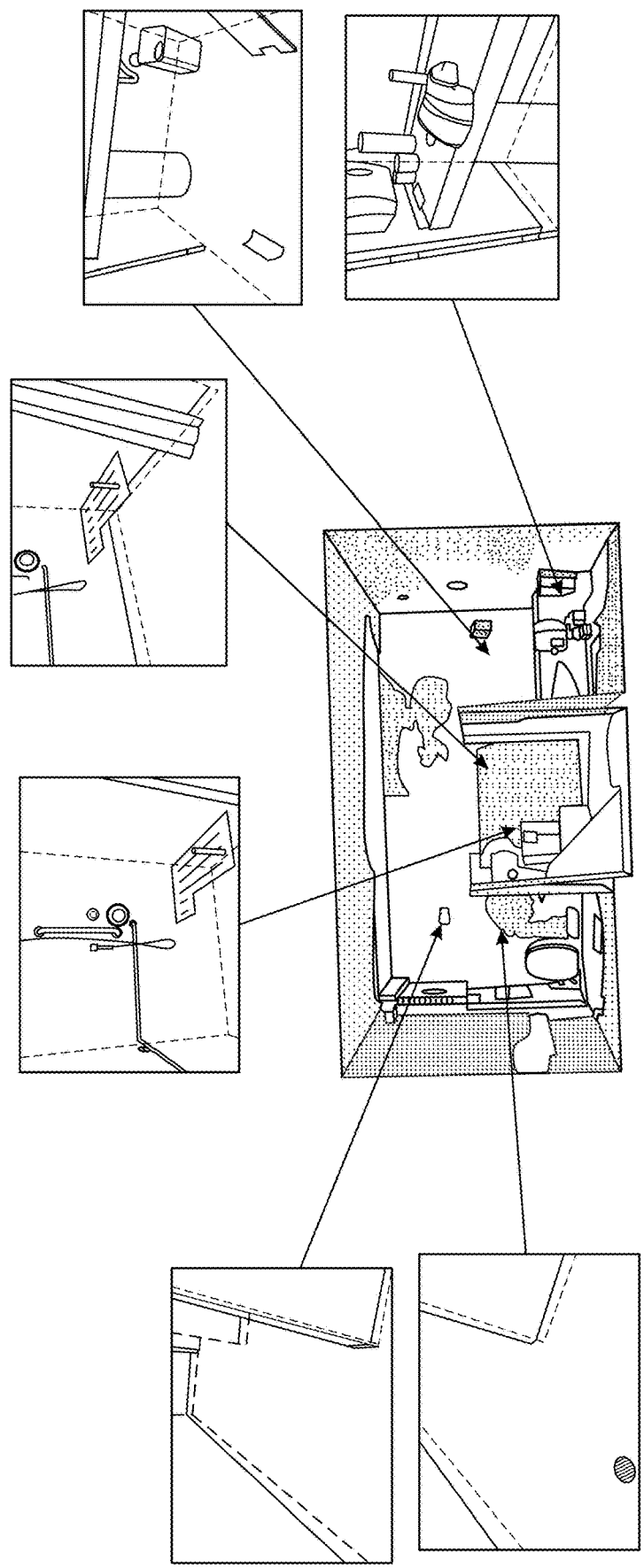
Figure 9C:
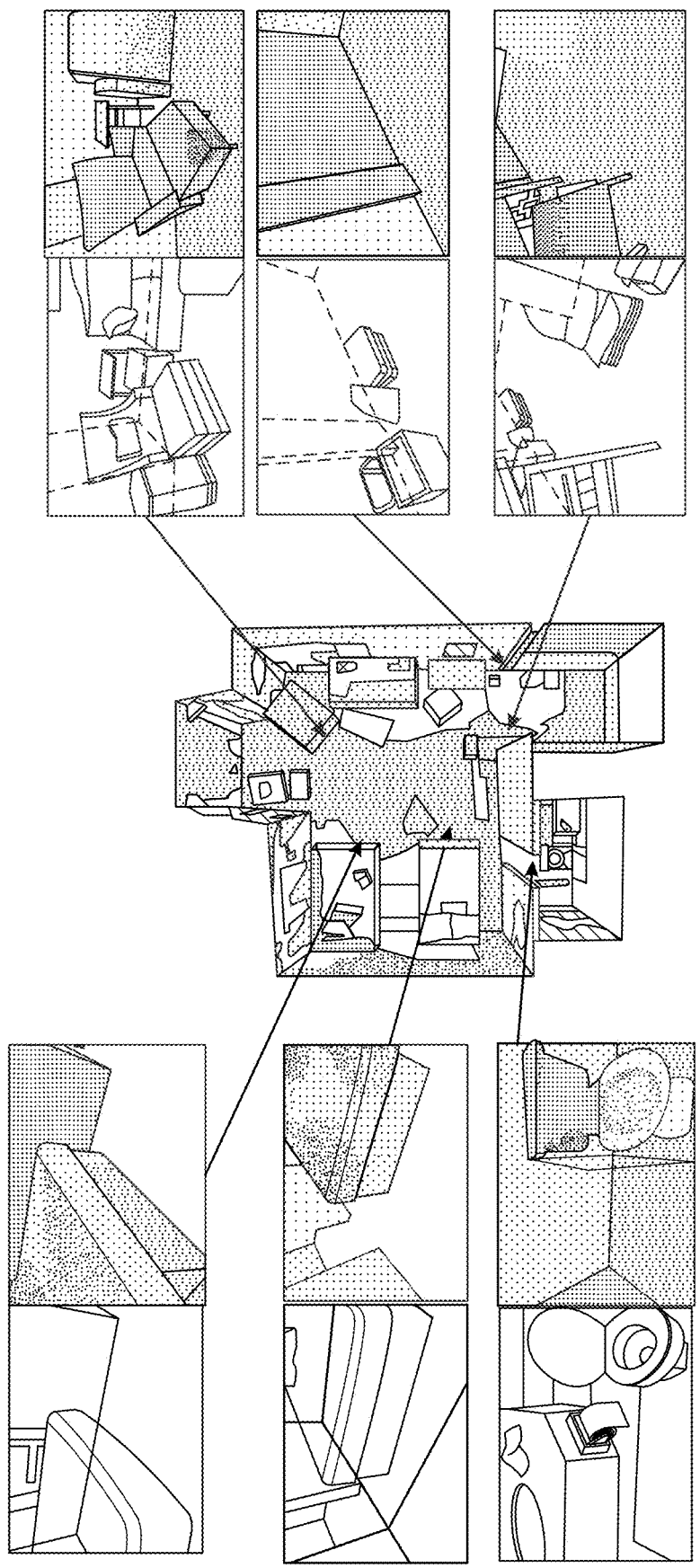
Figure 9D:
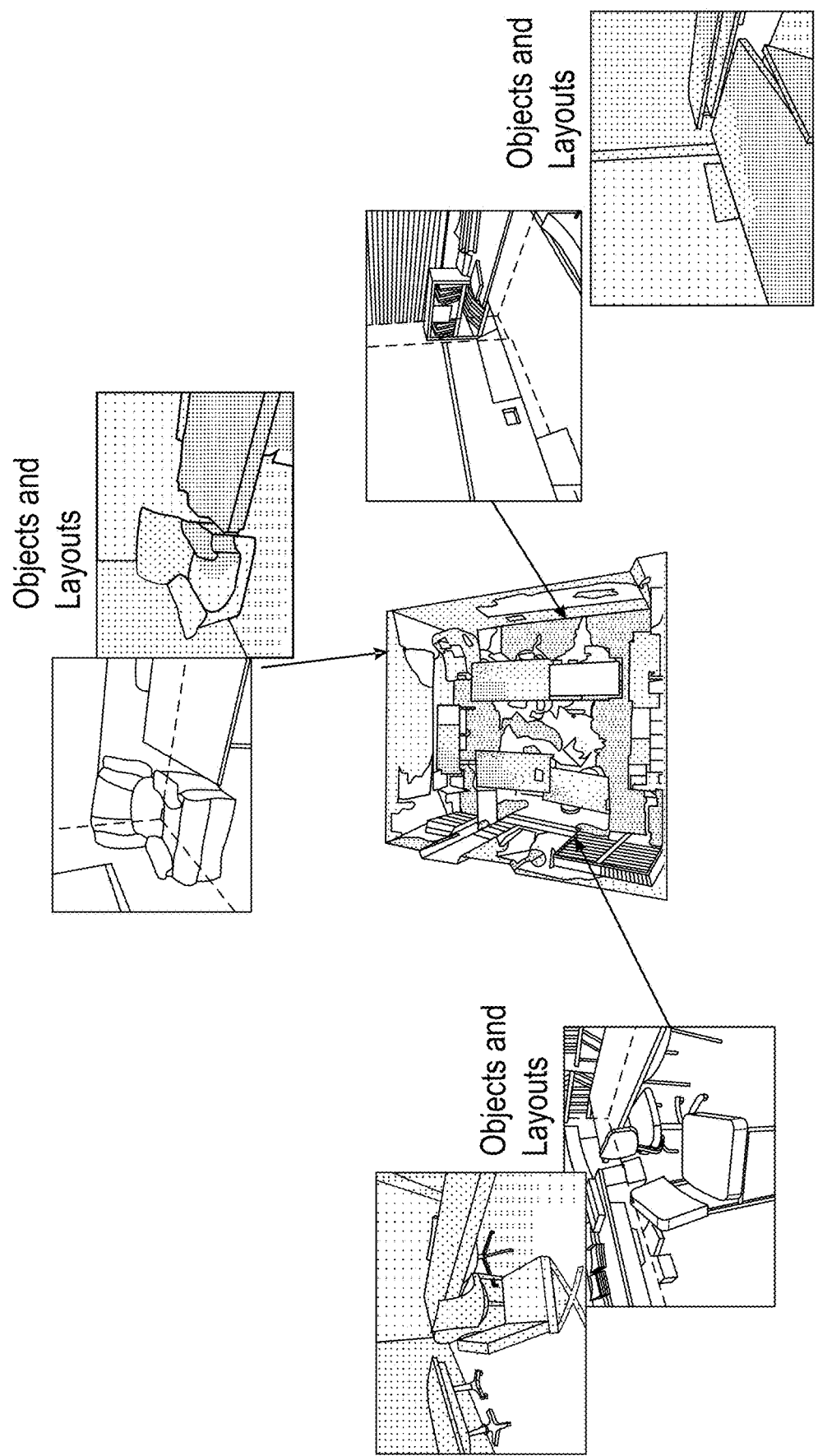
Figure 9E:
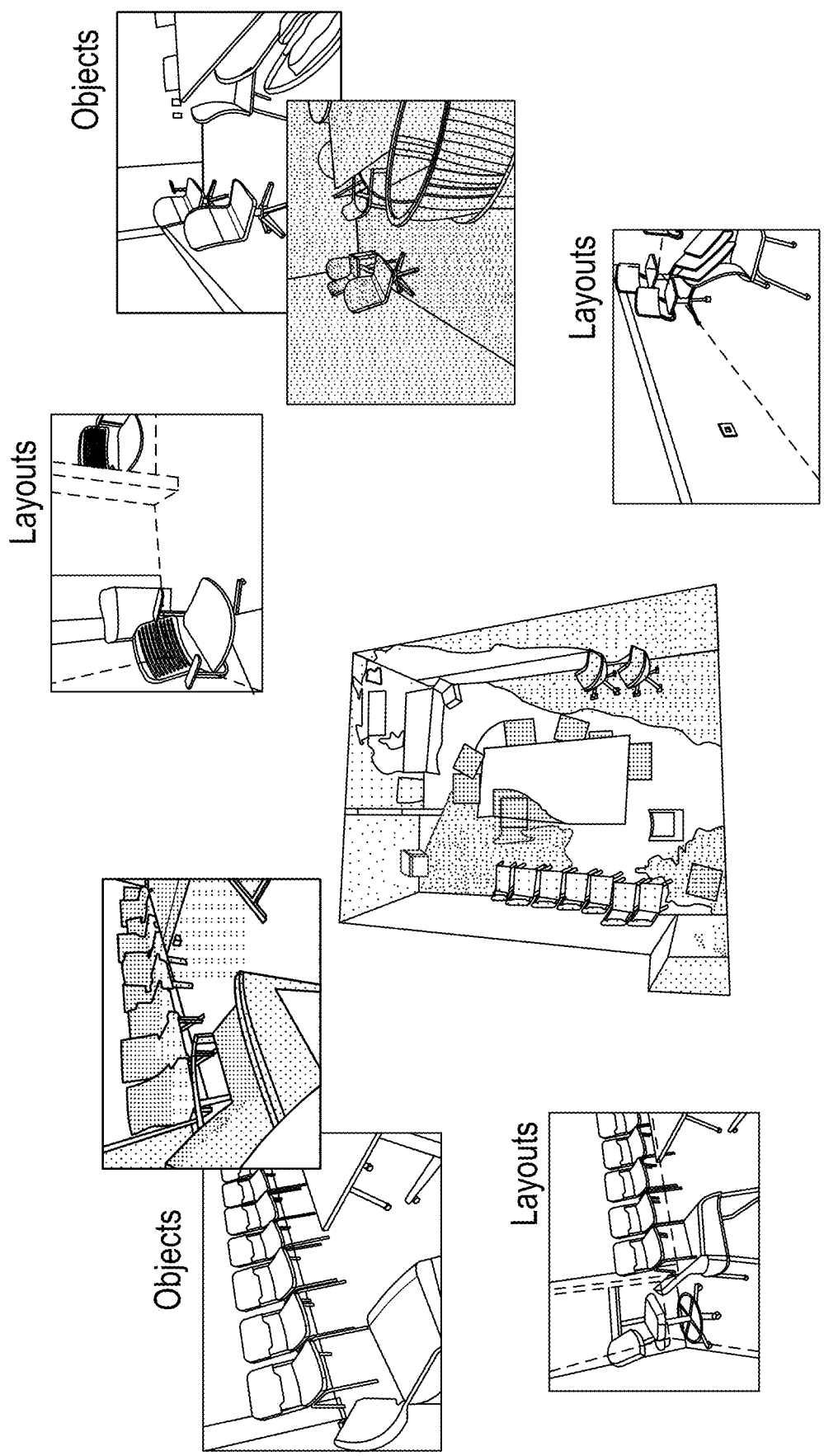

FIG. 8 is a diagram illustrating example MCTS operations for finding candidate representations (e.g., layouts, objects, etc.) in a structured tree. In this example, the MCTS operations include a selection operation 802, an expansion operation 804, a simulation operation 806, and an update operation 808. The selection operation 802 can include selecting one or more child nodes in the tree based on one or more factors such as for example, a policy or rule.

The expansion operation 804 can include adding one or more child nodes to the tree to expand the tree. The simulation operation 806 can include evaluating a new node in the tree by running simulations. In some examples, the simulations can be based on a policy or rule. The update operation 808 can include updating values and/or statistics in the tree based on the results of the simulations associated with the simulation operation 806.

In some examples, an adapted algorithm (MCSS as previously noted) based on MCTS can be used to efficiently search a scene tree, as further described herein. As previously noted, in some examples, MCSS can modify the upper confidence bound (UCB) criterion from Equation 1 into:

$$N_{child} \leftarrow \arg\max_{\mathcal{N} \in C(\mathcal{N}_{curr})} \lambda_1 \frac{Q(\mathcal{N})}{n(\mathcal{N})} + \lambda_2 \cdot \sqrt{\frac{\log n(\mathcal{N}_{curr})}{n(\mathcal{N})}} + \lambda_3^{n(\mathcal{N})} \text{fitness}(P(\mathcal{N}))$$

Equation (14)

where the first two terms make the standard UCB selectin criterion, the third term encourages the exploitation of more promising candidates, with a weight that decreases when the number of visits increases. Recall that fitness is related to the proposal and not the node. Q can be a sum of s, where s is defined in Equation 11, Equation 9 for $s_i$ and Equation 12 for $s^P$. As previously explained with reference to Equation 11, $w_i(O)=1$ if O is visible in view i and 0 otherwise.

In some cases, for a given set of potential candidates, a view score $v_i$ for view i defines how well the candidates agree with the RGB and depth data at view i. In some examples, for each of the given views of the scene, the given set of candidates can be rendered into the scene. For every view in the scene, the quality of selected candidates can be evaluated based on several criteria. Example criteria can include the following.

2D: Pixel error on semantic segmentation measures inconsistencies between rendered set of candidates and predictions from neural network (e.g., using MSEG). In some examples, multi-domain semantic segmentation (MSEG) can be used. MSEG is further described in Lambert, John, et al., "MSeg: A Composite Dataset for Multi-domain Semantic Segmentation", which is incorporated herein by reference in its entirety and for all purposes.

3D: Depth error measures inconsistencies between rendered set of candidates and data obtained from depth sensor.

Feasibility: Penalize for intersections between objects in the proposed solution and/or penalize for candidates in the proposed solution which are invisible in all of the rendered views.

An additional term called "fitness" can be added, which represents the probability of the object associated with the current node (e.g., represented as P(N)) being present in the scene. The fitness of the object can be continually updated during the tree search.

In some cases, the expansion, simulation, and update stages can be similar to standard MCTS.

A proposal fitness can describe how well a candidate fits the scene. The proposal can be initialized and updated. In some examples, the proposal can be individually rendered into the scene to evaluate its fitness. Fitness of the proposal can be constantly updated based on the quality of solutions that were previously found using this proposal in the tree search.

FIGS. 9A through 9E illustrate example results from an adapted algorithm based on MCTS used to efficiently search a scene tree. In the example in FIG. 9A, the results include recovered objects. In the example in FIG. 9B, the results include recovered layouts. In the example in FIG. 9C, the results include recovered room layouts and objects. In the examples in FIGS. 9D and 9E, the results include recovered objects and room layouts.

Figure 10A:
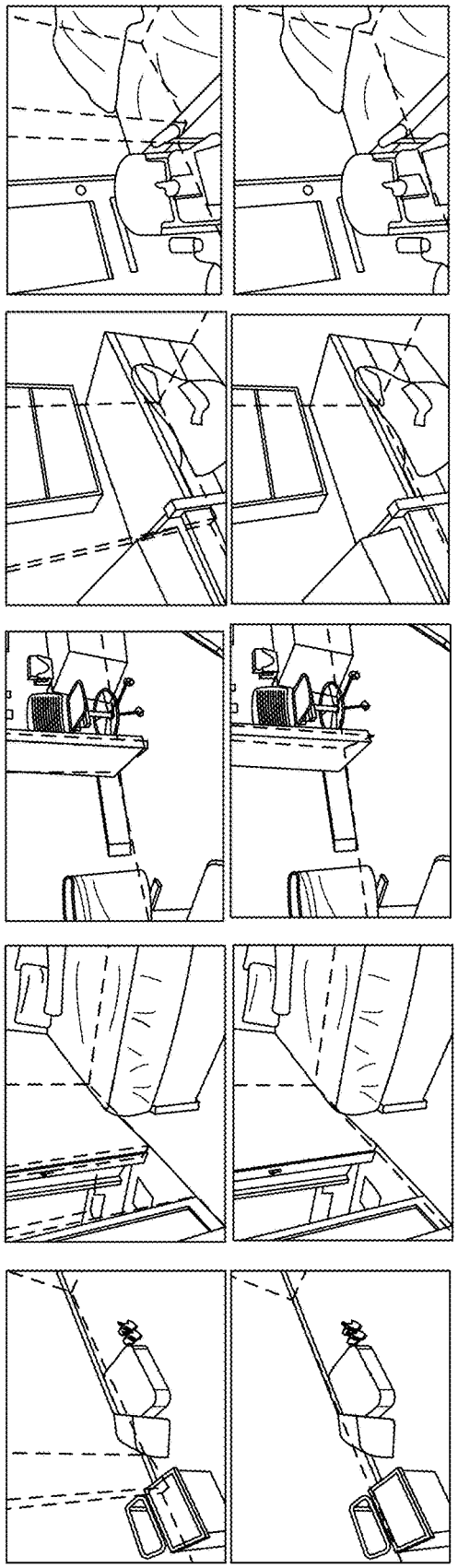
FIGS. 10A and 10B illustrate comparisons of example results from automatically generated layout and object annotations with results from manual layout annotations, in accordance with some examples.

FIG. 10A illustrates a comparison of results from automatically generated layout annotations 1002 as described herein with results from manual layout annotations 1004 from SceneCAD. SceneCAD is further described in Avetisyan et al., "SceneCAD: Predicting Object Alignments and Layouts in RGB-D Scans", ECCV 2020, which is incorporated herein by reference in its entirety and for all purposes. As shown in FIG. 10A, in the automatically generated layout annotations 1002, more detailed layouts can be recovered than in manual layout annotations 1004 from SceneCAD.

Figure 10B:
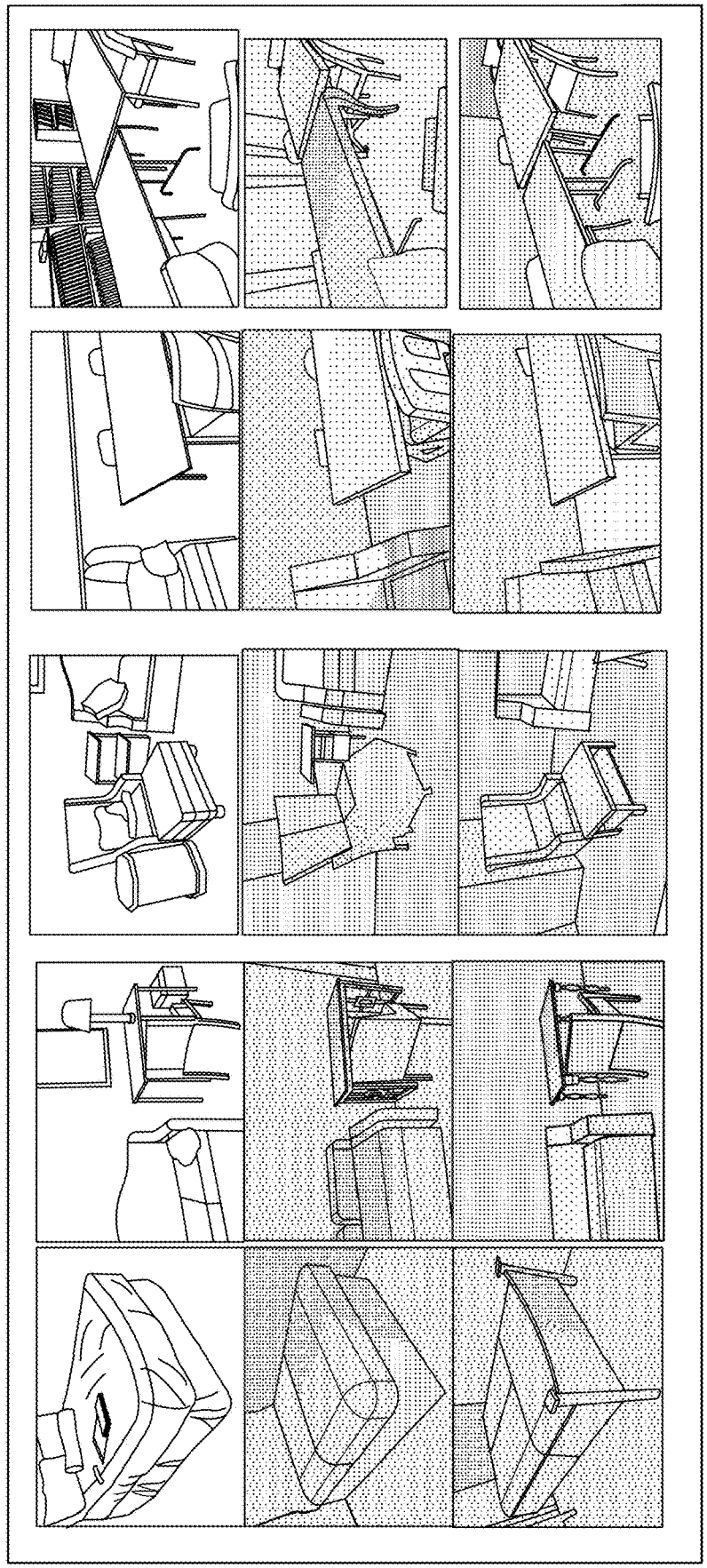

FIG. 10B illustrates a comparison of results from automatically generated object annotations 1020 as described herein with results from manual annotations 1022 from SceneCAD. As shown in FIG. 10B, in the automatically generated object annotations 1020, more detailed layouts can be recovered than in manual object annotations 1022 from SceneCAD.

FIG. 11 is a flowchart illustrating an example process 1100 for determining one or more environment layouts and objects. At block 1102, the process 1100 can include detecting, based on one or more images of an environment and depth information associated with the one or more images, a set of candidate layouts and a set of candidate objects corresponding to the environment. In some cases, the process 1100 can include obtaining the one or more images of the environment and the depth information associated with the one or more images. In some examples, the one or more images can include one or more red-green-blue images (RGB) and the depth information can include one or more depth maps of the environment. In some cases, the one or more images and the depth information can include one or more RGB-Depth (RGB-D) images. In some aspects, the environment includes a 3D scene.

In some examples, the set of candidate layouts can include a set of 3D layout models and associated poses. In some examples, the set of candidate objects can include a set of 3D object models and associated poses. In some cases, each candidate of the set of candidate layouts and the set of candidate objects includes a polygon corresponding to intersecting planes. In some cases, the intersecting planes include one or more two-dimensional planes. In some examples, the polygon includes a three-dimensional polygon. In some examples, the one or more polygons include one or more three-dimensional polygons. In some aspects, the process 1100 can include detecting one or more planes using a machine learning model. In some examples, the process 1100 can include detecting one or more planes using a machine learning model and semantic segmentation.

In some cases, to detect the set of candidate layouts, the process 1100 can include identifying, based on a semantic segmentation of a point cloud associated with the one or more images, 3D points corresponding to at least one of a wall of the environment and a floor of the environment. The process 1100 can include generating 3D planes based on the 3D points. The process 1100 can further include generating polygons based on intersections between at least some of the 3D planes. The process 1100 can include determining layout candidates based on the polygons as described herein.

In some examples, to detect the set of candidate objects, the process 1100 can include detecting 3D bounding box proposals for objects in a point cloud generated for the environment. For each bounding box proposal, the process 1100 can include retrieving a set of candidate object models from a dataset.

At block 1104, the process 1100 can include generating a structured tree comprising nodes corresponding to the set of candidate layouts and the set of candidate objects. In some examples, generating the structured tree can include organizing the set of candidate layouts and the set of candidate objects as a structured tree.

In some cases, the structured tree (or tree structure) includes multiple levels. For instance, each level can include a different set of incompatible candidates associated with the environment. In some examples, the different set of incompatible candidates include incompatible objects and/or incompatible layouts. In some cases, two or more candidates from the different set of incompatible candidates are incompatible when the two or more candidates intersect or are not spatial neighbors.

At block 1106, the process 1100 can include selecting a combination of objects and layouts in the structured tree. In some examples, selecting the combination of objects and layouts in the structured tree is based on a search of the structured tree. For instance, the search can be based on a Monte-Carlo Tree Search (MCTS) algorithm. For example, to select the combination of objects and layouts in the structured tree, the process 1100 can include performing a search of the structured tree using the Monte-Carlo Tree Search (MCTS) algorithm. In some aspects, the MCTS algorithm includes an adapted MCTS algorithm. For example, as described herein, the adapted MCTS algorithm can assign a fitness value to each node searched in the structured tree. In some cases, the fitness value represents a probability that at least one of an object and layout associated with the node is present in the environment.

In some examples, the adapted MCTS algorithm can generate a score for each node in the structured tree. For example, the score can be based on the adapted MCTS algorithm. In some examples, the score can include a weight assigned for one or more views at each node of the structured tree, an exploration term derived for MCTS, and the fitness value. In some examples, the weight is at least partly based on a view score for the one or more views, the view score for a view defining a consistency measurement between a candidate associated with a node associated with the view and data from the one or more images and the depth information associated with the view.

At block 1108, the process 1100 can include determining a three-dimensional (3D) layout of the environment based on the combination of objects and layouts in the structured tree. In some examples, the process 1100 can include generating virtual content based on the determined 3D layout of the environment. For instance, the process 1100 can use the virtual content to augment a scene or view of the environment. In some aspects, the process 1100 can include sharing the determined 3D layout of the environment with a computing device. For instance, the process 1100 can transmit the 3D layout to the computing device (e.g., in a multi-player game or other application), upload the 3D layout to a server-based system accessible by the computing device, or otherwise share the 3D layout.

In some examples, the process 1100 may be performed by a computing device or an apparatus, such as a computing device implementing the scene estimation system 120. In one example, the computing device can have the computing device architecture 1200 shown in FIG. 12, which can also include the scene estimation system 120. In some cases, the computing device or apparatus may include one or more input devices, one or more output devices, one or more processors, one or more microprocessors, one or more microcomputers, and/or other component(s) that is/are configured to carry out the steps of process 1100. In some examples, the computing device or apparatus may include a camera configured to capture images. For example, the computing device may include a camera device. As another example, the computing device may include a mobile device with a camera (e.g., a mobile phone or tablet including a camera, or other type of device with a camera). In some cases, the computing device can include one or more communications transceivers and/or one or more video codecs. In some cases, the computing device may include a display for displaying images. In some examples, a camera or other capture device that captures the video data is separate from the computing device, in which case the computing device receives the captured video data. The computing device may further include a network interface configured to communicate the video data. The network interface may be configured to communicate Internet Protocol (IP) based data or any other suitable data.

The components of the computing device (e.g., the one or more processors, one or more microprocessors, one or more microcomputers, and/or other component) can be implemented in circuitry. For example, the components can include and/or can be implemented using electronic circuits or other electronic hardware, which can include one or more programmable electronic circuits (e.g., microprocessors, graphics processing units (GPUs), digital signal processors (DSPs), central processing units (CPUs), and/or other suitable electronic circuits), and/or can include and/or be implemented using computer software, firmware, or any combination thereof, to perform the various operations described herein.

The process 1100 is illustrated as a logical flow diagram, the operation of which represent a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

Additionally, the process 1100 may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory.

Figure 12:
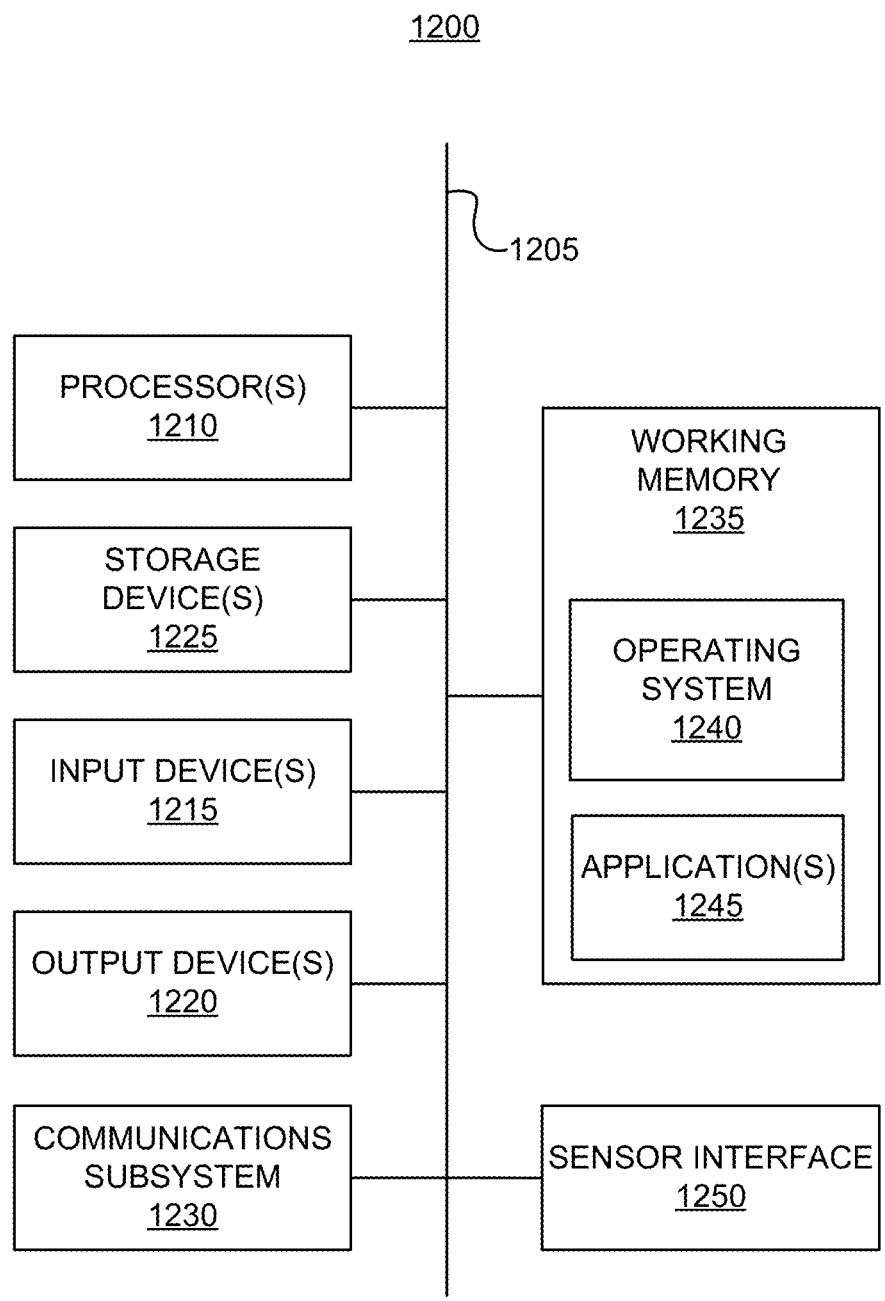
FIG. 12 illustrates an example of a computing system in which one or more embodiments may be implemented.

FIG. 12 illustrates an example computing device 1200 incorporating parts of a computing device that can be used to performing one or more of the techniques described herein. A computing device as illustrated in FIG. 12 may be incorporated as part of any computerized system, such as the scene estimation system 120. In some examples, the computing device 1200 may represent some of the components of a mobile device, or a computing device executing the scene estimation system 120 described herein or related tool. Examples of a computing device 1200 include, but are not limited to, desktops, workstations, personal computers, supercomputers, video game consoles, tablets, smartphones, laptops, netbooks, or other portable devices. FIG. 12 provides a schematic illustration of one embodiment of a computing device 1200 that may perform the methods provided by various other embodiments, as described herein, and/or may function as the host computing device, a remote kiosk/terminal, a point-of-sale device, a mobile multifunction device, a set-top box and/or a computing device. FIG. 12 is meant only to provide a generalized illustration of various components, any or all of which may be utilized as appropriate. FIG. 12, therefore, broadly illustrates how individual system elements may be implemented in a relatively separated or relatively more integrated manner.

The computing device 1200 is shown comprising hardware elements that may be electrically coupled via a bus 1205 (or may otherwise be in communication, as appropriate). The hardware elements may include one or more processors 1210, including without limitation one or more general-purpose processors and/or one or more special-purpose processors (such as digital signal processing chips, graphics acceleration processors, and/or the like); one or more input devices 1215, which may include without limitation a camera, sensors 1250, a mouse, a keyboard and/or the like; and one or more output devices 1220, which may include without limitation a display unit, a printer and/or the like.

The computing device 1200 may further include (and/or be in communication with) one or more non-transitory storage devices 1225, which may comprise, without limitation, local and/or network accessible storage, and/or may include, without limitation, a disk drive, a drive array, an optical storage device, a solid-form storage device such as a random access memory ("RAM") and/or a read-only memory ("ROM"), which may be programmable, flash-updateable and/or the like. Such storage devices may be configured to implement any appropriate data storage, including without limitation, various file systems, database structures, and/or the like.

The computing device 1200 might also include a communications subsystem 1230. The communications subsystem 1230 may include a transceiver for receiving and transmitting data or a wired and/or wireless medium. The communications subsystem 1230 may also include without limitation a modem, a network card (wireless or wired), an infrared communication device, a wireless communication device and/or chipset (such as a Bluetooth☐ device, an 802.11 device, a WiFi device, a WiMax device, cellular communication facilities, etc.), and/or the like. The communications subsystem 1230 may permit data to be exchanged with a network (such as the network described below, to name one example), other computing devices, and/or any other devices described herein. In many embodiments, the computing device 1200 will further comprise a non-transitory working memory 1235, which may include a RAM or ROM device, as described above.

The computing device 1200 may comprise software elements, shown as being currently located within the working memory 1235, including an operating system 1240, device drivers, executable libraries, and/or other code, such as one or more application programs 1245, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions may be used to configure and/or adapt a general purpose computer (or other device) to perform one or more operations in accordance with the described methods.

A set of these instructions and/or code might be stored on a computer-readable storage medium, such as the storage device(s) 1225 described above. In some cases, the storage medium might be incorporated within a computing device, such as computing device 1200. In other embodiments, the storage medium might be separate from a computing device (e.g., a removable medium, such as a compact disc), and/or provided in an installation package, such that the storage medium may be used to program, configure and/or adapt a general purpose computer with the instructions/code stored thereon. These instructions might take the form of executable code, which is executable by the computing device 1200 and/or might take the form of source and/or installable code, which, upon compilation and/or installation on the computing device 1200 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices 1200 such as network input/output devices may be employed.

Some embodiments may employ a computing device (such as the computing device 1200) to perform methods in accordance with the disclosure. For example, some or all of the procedures of the described methods may be performed by the computing device 1200 in response to processor 1210 executing one or more sequences of one or more instructions (which might be incorporated into the operating system 1240 and/or other code, such as an application program 1245) contained in the working memory 1235. Such instructions may be read into the working memory 1235 from another computer-readable medium, such as one or more of the storage device(s) 1225. Merely by way of example, execution of the sequences of instructions contained in the working memory 1235 might cause the processor(s) 1210 to perform one or more procedures of the methods described herein.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Specific details are provided in the description above to provide a thorough understanding of the embodiments and examples provided herein. However, it will be understood by one of ordinary skill in the art that the embodiments may be practiced without these specific details. For clarity of explanation, in some instances the present technology may be presented as including individual functional blocks including functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Individual embodiments may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

Devices implementing processes and methods according to these disclosures can include hardware, software, firmware, middleware, microcode, hardware description languages, or any combination thereof, and can take any of a variety of form factors.

When implemented in software, firmware, middleware, or microcode, the program code or code segments to perform the necessary tasks (e.g., a computer-program product) may be stored in a computer-readable or machine-readable medium. A processor(s) may perform the necessary tasks. Typical examples of form factors include laptops, smartphones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" refers to any component that is physically connected to another component either directly or indirectly, and/or any component that is in communication with another component (e.g., connected to the other component over a wired or wireless connection, and/or other suitable communication interface) either directly or indirectly.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

The various illustrative logical blocks, modules, circuits, and algorithm steps described in connection with the embodiments disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials.

The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

Illustrative Examples of the Disclosure Include:

Aspect 1: An apparatus for determining one or more environmental layouts, comprising: at least one memory; and at least one processor coupled to the at least one memory and configured to: obtain one or more images of an environment and depth information associated with the one or more images; detect, based on one or more images of an environment and depth information associated with the one or more images, a set of candidate layouts and a set of candidate objects corresponding to the environment; generate a structured tree including nodes corresponding to the set of candidate layouts and the set of candidate objects; select a combination of objects and layouts in the structured tree; and determine a three-dimensional (3D) layout of the environment based on the combination of objects and layouts in the structured tree.

Aspect 2: The apparatus of Aspect 1, wherein, to select the combination of objects and layouts in the structured tree, the at least one processor is configured to perform a search of the structured tree using a Monte-Carlo Tree Search (MCTS) algorithm.

Aspect 3: The apparatus of Aspect 2, wherein the MCTS algorithm comprises an adapted MCTS algorithm, wherein the adapted MCTS algorithm assigns a fitness value to each node searched in the structured tree, the fitness value representing a probability that at least one of an object and layout associated with the node is present in the environment.

Aspect 4: The apparatus of Aspect 3, wherein the at least one processor is further configured to generate a score for each node in the structured tree, the score being based on the adapted MCTS algorithm, the score comprising a weight assigned for one or more views at each node of the structured tree, an exploration term derived for MCTS, and the fitness value.

Aspect 5: The apparatus of Aspect 4, wherein the weight is at least partly based on a view score for the one or more views, the view score for a view defining a consistency measurement between a candidate associated with a node associated with the view and data from the one or more images and the depth information associated with the view.

Aspect 6: The apparatus of any of Aspects 1 to 5, wherein the set of candidate layouts comprises a set of 3D layout models and associated poses, and wherein the set of candidate objects comprises a set of 3D object models and associated poses.

Aspect 7: The apparatus of any of Aspects 1 to 6, wherein the one or more images comprise one or more red-green-blue images (RGB) and the depth information comprises one or more depth maps of the environment.

Aspect 8: The apparatus of any of Aspects 1 to 7, wherein the one or more images and the depth information comprise one or more RGB-Depth (RGB-D) images.

Aspect 9: The apparatus of any of Aspects 1 to 8, wherein detecting the set of candidate layouts comprises: identifying, based on a semantic segmentation of a point cloud associated with the one or more images, 3D points corresponding to at least one of a wall of the environment and a floor of the environment; generating 3D planes based on the 3D points; generating polygons based on intersections between at least some of the 3D planes; and determining layout candidates based on the polygons.

Aspect 10: The apparatus of any of Aspects 1 to 9, wherein detecting the set of candidate objects comprises: detecting 3D bounding box proposals for objects in a point cloud generated for the environment; and for each bounding box proposal, retrieve a set of candidate object models from a dataset.

Aspect 11: The apparatus of any of Aspects 1 to 10, wherein the structured tree comprises multiple levels, wherein each level comprises a different set of incompatible candidates associated with the environment, wherein the different set of incompatible candidates comprise at least one of incompatible objects and incompatible layouts.

Aspect 12: The apparatus of Aspect 11, wherein two or more candidates from the different set of incompatible candidates are incompatible when the two or more candidates intersect or are not spatial neighbors.

Aspect 13: The apparatus of any of Aspects 1 to 12, wherein the environment comprises a 3D scene.

Aspect 14: The apparatus of any of Aspects 1 to 13, wherein each candidate of the set of candidate layouts and the set of candidate objects comprises a polygon corresponding to intersecting planes.

Aspect 15: The apparatus of Aspect 14, wherein the intersecting planes include one or more two-dimensional planes.

Aspect 16: The apparatus of any of Aspects 14 or 15, wherein the polygon includes a three-dimensional polygon.

Aspect 17: The apparatus of any of Aspects 1 to 16, wherein the apparatus is a mobile device including a camera for capturing the one or more images.

Aspect 18: The apparatus of any of Aspects 1 to 17, wherein the at least one processor is configured to: generate virtual content based on the determined 3D layout of the environment.

Aspect 19: The apparatus of any of Aspects 1 to 18, wherein the at least one processor is configured to: share the determined 3D layout of the environment with a computing device.

Aspect 20: A method for determining one or more environmental layouts, comprising: obtaining one or more images of an environment and depth information associated with the one or more images; detecting, based on one or more images of an environment and depth information associated with the one or more images, a set of candidate layouts and a set of candidate objects corresponding to the environment; generating a structured tree including nodes corresponding to the set of candidate layouts and the set of candidate objects; selecting a combination of objects and layouts in the structured tree; and determining a three-dimensional (3D) layout of the environment based on the combination of objects and layouts in the structured tree.

Aspect 21: The method of Aspect 20, wherein selecting the combination of objects and layouts in the structured tree is based on a search of the structured tree using a Monte-Carlo Tree Search (MCTS) algorithm.

Aspect 22: The method of Aspect 21, wherein the MCTS algorithm comprises an adapted MCTS algorithm, wherein the adapted MCTS algorithm assigns a fitness value to each node searched in the structured tree, the fitness value representing a probability that at least one of an object and layout associated with the node is present in the environment.

Aspect 23: The method of Aspect 22, further comprising generating a score for each node in the structured tree, the score being based on the adapted MCTS algorithm, the score comprising a weight assigned for one or more views at each node of the structured tree, an exploration term derived for MCTS, and the fitness value.

Aspect 24: The method of Aspect 23, wherein the weight is at least partly based on a view score for the one or more views, the view score for a view defining a consistency measurement between a candidate associated with a node associated with the view and data from the one or more images and the depth information associated with the view.

Aspect 25: The method of Aspect 20, wherein the set of candidate layouts comprises a set of 3D layout models and associated poses, and wherein the set of candidate objects comprises a set of 3D object models and associated poses.

Aspect 26: The method of any of Aspects 20 or 25, wherein the one or more images comprise one or more red-green-blue images (RGB) and the depth information comprises one or more depth maps of the environment.

Aspect 27: The method of any of Aspects 20 to 26, wherein the one or more images and the depth information comprise one or more RGB-Depth (RGB-D) images.

Aspect 28: The method of any of Aspects 20 to 27, wherein detecting the set of candidate layouts comprises: identifying, based on a semantic segmentation of a point cloud associated with the one or more images, 3D points corresponding to at least one of a wall of the environment and a floor of the environment; generating 3D planes based on the 3D points; generating polygons based on intersections between at least some of the 3D planes; and determining layout candidates based on the polygons.

Aspect 29: The method of any of Aspects 20 to 28, wherein detecting the set of candidate objects comprises: detecting 3D bounding box proposals for objects in a point cloud generated for the environment; and for each bounding box proposal, retrieve a set of candidate object models from a dataset.

Aspect 30: The method of any of Aspects 20 to 29, wherein the structured tree comprises multiple levels, wherein each level comprises a different set of incompatible candidates associated with the environment, wherein the different set of incompatible candidates comprise at least one of incompatible objects and incompatible layouts.

Aspect 31: The method of Aspect 30, wherein two or more candidates from the different set of incompatible candidates are incompatible when the two or more candidates intersect or are not spatial neighbors.

Aspect 32: The method of any of Aspects 20 to 31, wherein the environment comprises a 3D scene.

Aspect 33: The method of any of Aspects 20 to 32, wherein each candidate of the set of layout candidates and the set of object candidates comprises a polygon corresponding to intersecting planes.

Aspect 34: The method of Aspect 33, wherein the intersecting planes include one or more two-dimensional planes.

Aspect 35: The method of any of Aspects 33 or 34, wherein the polygon includes a three-dimensional polygon.

Aspect 36: The method of any of Aspects 20 to 35, further comprising generating virtual content based on the determined 3D layout of the environment.

Aspect 37: The method of any of Aspects 20 to 36, further comprising sharing the determined 3D layout of the environment with a computing device.

Aspect 38: A non-transitory computer-readable storage medium having stored thereon instructions which, when executed by one or more processors, cause the one or more processors to perform a method according to any of Aspects to 1 to 37.

Aspect 39: An apparatus comprising means for performing a method according to any of Aspects 1 to 37.

What is claimed is:

1. An apparatus for determining one or more environmental layouts, comprising:
at least one memory; and
at least one processor coupled to the at least one memory and configured to:
detect, based on one or more images of an environment and depth information associated with the one or more images, a set of candidate layouts and a set of candidate objects corresponding to the environment;
generate a structured tree comprising nodes corresponding to the set of candidate layouts and the set of candidate objects;
perform a search of the structured tree using a tree search algorithm to determine a respective score for each node in the structured tree, each score comprising a weight assigned for one or more views associated with each node of the structured tree, an exploration term derived for the tree search algorithm, and a fitness value;
select, based on the respective score determined for each node in the structured tree, a combination of objects and layouts in the structured tree; and
determine a three-dimensional (3D) layout of the environment based on the combination of objects and layouts in the structured tree.

2. The apparatus of claim 1, wherein the tree search algorithm includes a Monte-Carlo Tree Search (MCTS) algorithm.

3. The apparatus of claim 2, wherein the MCTS algorithm comprises an adapted MCTS algorithm, wherein the adapted MCTS algorithm assigns a fitness value to each node searched in the structured tree, the fitness value representing a probability that at least one of an object or layout associated with the node is present in the environment.

4. The apparatus of claim 1, wherein the weight is at least partly based on a respective view score for each view of the one or more views, and wherein a view score for a view defines a consistency measurement between a candidate associated with a node associated with the view and data from the one or more images and the depth information associated with the view.

5. The apparatus of claim 1, wherein the set of candidate layouts comprises a set of 3D layout models and associated poses, and wherein the set of candidate objects comprises a set of 3D object models and associated poses.

6. The apparatus of claim 1, wherein the one or more images comprise one or more red-green-blue images (RGB) and the depth information comprises one or more depth maps of the environment.

7. The apparatus of claim 1, wherein the one or more images and the depth information comprise one or more RGB-Depth (RGB-D) images.

8. The apparatus of claim 1, wherein, to detect the set of candidate layouts, the at least one processor is configured to:
   identify, based on a semantic segmentation of a point cloud associated with the one or more images, 3D points corresponding to at least one of a wall of the environment and a floor of the environment;
   generate 3D planes based on the 3D points;
   generate polygons based on intersections between at least some of the 3D planes; and
   determine layout candidates based on the polygons.

9. The apparatus of claim 1, wherein, to detect the set of candidate objects, the at least one processor is configured to:
   detect 3D bounding box proposals for objects in a point cloud generated for the environment; and
   for each bounding box proposal, retrieve a set of candidate object models from a dataset.

10. The apparatus of claim 1, wherein the structured tree comprises multiple levels, wherein each level of multiple levels comprises a different set of incompatible candidates associated with the environment, and wherein the different set of incompatible candidates comprise at least one of incompatible objects and incompatible layouts.

11. The apparatus of claim 10, wherein two or more candidates from the different set of incompatible candidates are incompatible when the two or more candidates intersect or are not spatial neighbors.

12. The apparatus of claim 1, wherein the environment comprises a 3D scene.

13. The apparatus of claim 1, wherein each candidate of the set of candidate layouts and the set of candidate objects comprises a polygon corresponding to intersecting planes.

14. The apparatus of claim 13, wherein the intersecting planes include one or more two-dimensional planes.

15. The apparatus of claim 13, wherein the polygon includes a three-dimensional polygon.

16. The apparatus of claim 1, wherein the at least one processor is configured to:
   generate virtual content based on the determined 3D layout of the environment.

17. The apparatus of claim 1, wherein the at least one processor is configured to:
   share the determined 3D layout of the environment with a computing device.

18. The apparatus of claim 1, wherein the apparatus is a mobile device including a camera for capturing the one or more images.

19. A method for determining one or more environmental layouts, comprising:
   detecting, based on one or more images of an environment and depth information associated with the one or more images, a set of candidate layouts and a set of candidate objects corresponding to the environment;
   generating a structured tree comprising nodes corresponding to the set of candidate layouts and the set of candidate objects;
   perform a search of the structured tree using a tree search algorithm to determine a respective score for each node in the structured tree, each score comprising a weight assigned for one or more views associated with each node of the structured tree, an exploration term derived for the tree search algorithm, and a fitness value;
   selecting, based on the respective score determined for each node in the structured tree, a combination of objects and layouts in the structured tree; and
   determining a three-dimensional (3D) layout of the environment based on the combination of objects and layouts in the structured tree.

20. The method of claim 19, wherein the tree search algorithm includes a Monte-Carlo Tree Search (MCTS) algorithm.

21. The method of claim 20, wherein the MCTS algorithm comprises an adapted MCTS algorithm, wherein the adapted MCTS algorithm assigns a fitness value to each node searched in the structured tree, the fitness value representing a probability that at least one of an object or layout associated with the node is present in the environment.

22. The method of claim 19, wherein the set of candidate layouts comprises a set of 3D layout models and associated poses, and wherein the set of candidate objects comprises a set of 3D object models and associated poses.

23. The method of claim 19, wherein the one or more images comprise one or more red-green-blue images (RGB) and the depth information comprises one or more depth maps of the environment.

24. The method of claim 19, wherein the one or more images and the depth information comprise one or more RGB-Depth (RGB-D) images.

25. The method of claim 19, wherein detecting the set of candidate layouts comprises:
   identifying, based on a semantic segmentation of a point cloud associated with the one or more images, 3D points corresponding to at least one of a wall of the environment and a floor of the environment;
   generating 3D planes based on the 3D points;
   generating polygons based on intersections between at least some of the 3D planes; and
   determining layout candidates based on the polygons.

26. The method of claim 19, wherein detecting the set of candidate objects comprises:
   detecting 3D bounding box proposals for objects in a point cloud generated for the environment; and
   for each bounding box proposal, retrieve a set of candidate object models from a dataset.

27. The method of claim 19, wherein the structured tree comprises multiple levels, wherein each level of the multiple levels comprises a different set of incompatible candidates associated with the environment, and wherein the different set of incompatible candidates comprise at least one of incompatible objects and incompatible layouts.

28. The method of claim 19, further comprising:
   generating virtual content based on the determined 3D layout of the environment.

29. The method of claim 19, further comprising:
sharing the determined 3D layout of the environment with a computing device.

30. The method of 19, wherein the weight is at least partly based on a respective view score for each view of the one or more views, and wherein a view score for a view defines a consistency measurement between a candidate associated with a node associated with the view and data from the one or more images and the depth information associated with the view.

* * * * *

UNITED STATES PATENT AND TRADEMARK OFFICE
CERTIFICATE OF CORRECTION

| | |
|---|---|
| PATENT NO. | : 11,797,724 B2 |
| APPLICATION NO. | : 17/454020 |
| DATED | : October 24, 2023 |
| INVENTOR(S) | : Shreyas Hampali et al. |

It is certified that error appears in the above-identified patent and that said Letters Patent is hereby corrected as shown below:

On the Title Page

Item (73) Assignee:
Replace "QUALCOMM Incorporated, San Diego, CA (US)" with -- QUALCOMM Technologies, Inc., San Diego, CA (US) --

Signed and Sealed this
First Day of October, 2024

Katherine Kelly Vidal
*Director of the United States Patent and Trademark Office*